(12) United States Patent
Wu et al.

(10) Patent No.: US 10,319,695 B2
(45) Date of Patent: Jun. 11, 2019

(54) SEMICONDUCTOR DEVICE AND BUMP FORMATION PROCESS

(71) Applicant: TAIWAN SEMICONDUCTOR MANUFACTURING CO., LTD., Hsinchu (TW)

(72) Inventors: Sheng-Yu Wu, Hsinchu (TW); Ching-Hui Chen, Hsinchu (TW); Mirng-Ji Lii, Hsinchu County (TW); Kai-Di Wu, Tainan (TW); Chien-Hung Kuo, Tainan (TW); Chao-Yi Wang, Tainan (TW); Hon-Lin Huang, Hsinchu (TW); Zi-Zhong Wang, Tainan (TW); Chun-Mao Chiu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/715,659

(22) Filed: Sep. 26, 2017

(65) Prior Publication Data

US 2019/0006303 A1 Jan. 3, 2019

Related U.S. Application Data

(60) Provisional application No. 62/526,980, filed on Jun. 29, 2017.

(51) Int. Cl.
*H01L 23/00* (2006.01)

(52) U.S. Cl.
CPC .............. *H01L 24/13* (2013.01); *H01L 24/08* (2013.01); *H01L 24/11* (2013.01); *H01L 2224/1147* (2013.01); *H01L 2224/13144* (2013.01); *H01L 2224/13155* (2013.01)

(58) Field of Classification Search
CPC ......... H01L 24/13; H01L 24/11; H01L 24/08; H01L 2224/13155; H01L 2224/1147; H01L 2224/13144
USPC ........................................................ 257/737
See application file for complete search history.

(56) References Cited

U.S. PATENT DOCUMENTS

| 7,166,532 | B2* | 1/2007 | Chun | H01L 21/76807 257/E21.585 |
| 2003/0127734 | A1* | 7/2003 | Lee | H01L 24/11 257/737 |
| 2004/0102037 | A1* | 5/2004 | Tanida | H01L 24/11 438/669 |
| 2005/0272218 | A1* | 12/2005 | Park | H01L 27/10894 438/386 |

* cited by examiner

*Primary Examiner* — Marc Anthony Armand
*Assistant Examiner* — Sue Tang
(74) *Attorney, Agent, or Firm* — Maschoff Brennan

(57) ABSTRACT

A semiconductor device includes a semiconductor substrate. A pad region is disposed on the semiconductor substrate. A micro bump is disposed on the pad region. The micro bump has a first portion on the pad region and a second portion on the first portion. The first portion and the second portion have different widths. The first portion has a first width and the second portion has a second width. The first width is larger or smaller than the second width. The micro bump includes nickel and gold. The semiconductor device also includes a passivation layer overlying a portion of the pad region.

20 Claims, 24 Drawing Sheets

SEMICONDUCTOR DEVICE AND BUMP FORMATION PROCESS

CROSS-REFERENCE TO RELATED APPLICATION

This application claims priority to U.S. Provisional Application Ser. No. 62/526,980, filed Jun. 29, 2017, which is herein incorporated by reference in its entirety.

BACKGROUND

Modern integrated circuits are made up of literally millions of active and/or passive devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bumps are formed and exposed on the surface of the respective chip. Electrical connections are made through bumps to connect the chip to another element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
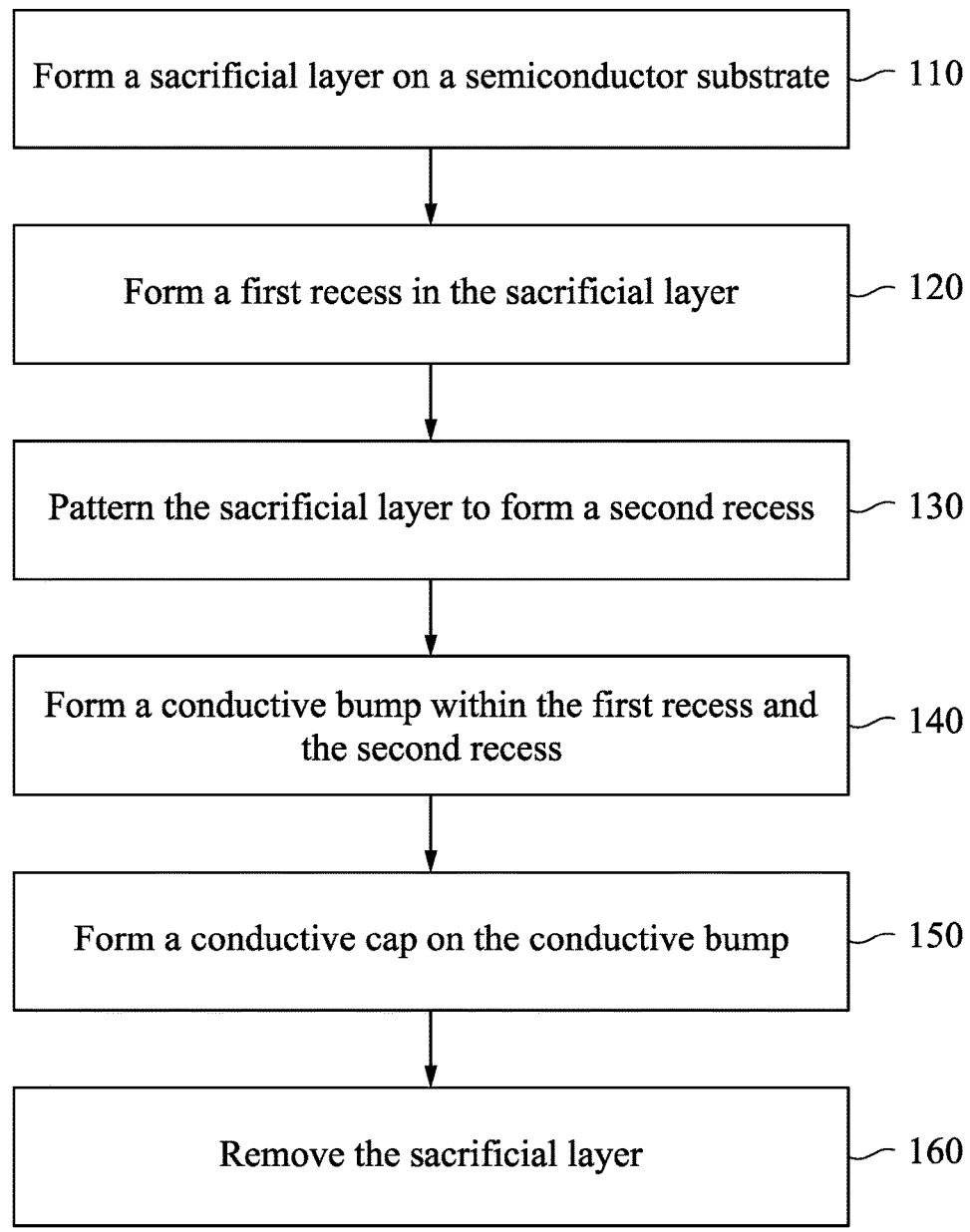
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1, a flow chart of a method 100 of fabricating a semiconductor device in accordance with some embodiments of the instant disclosure. The method begins with operation 110 in which a sacrificial layer is formed on a semiconductor substrate. The method continues with operation 120 in which a first recess is formed in the sacrificial layer. Subsequently, operation 130 is performed. The sacrificial layer is patterned to form a second recess. The method continues with operation 140 in which a conductive bump is formed within the first recess and the second recess. The method continues with operation 150 in which a conductive cap is formed on the conductive bump. The method continues with operation 160 in which the sacrificial layer is removed.

FIGS. 2-8 are cross-sectional views of a portion of a semiconductor device at various stages in a bump formation process in accordance with some embodiments of the instant disclosure.

With reference to FIGS. 2-8, an exemplary device semiconductor substrate 10 used for bump fabrication is employed in a semiconductor device fabrication, and integrated circuits may be formed therein and/or thereupon. The semiconductor substrate 10 is defined to mean any construction including semiconductor materials, such as bulk silicon, a semiconductor wafer, a silicon-on-insulator (SOI) substrate, a silicon germanium substrate, or the like. Other semiconductor materials including group III, group IV, and group V elements may also be used. The substrate 10 may further comprise a plurality of isolation features (not shown), such as shallow trench isolation (STI) features, local oxidation of silicon (LOCOS) features, or the like. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), resistors, diodes, capacitors, inductors, fuses, or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory (SRAM)), radio frequency (RF) device, input/output (I/O) device, system-on-chip (SoC) device, combinations thereof, or other suitable types of devices.

The substrate 10 further includes inter-layer dielectric layers and a metallization structure overlying the integrated circuits. The inter-layer dielectric layers include low-k dielectric materials, un-doped silicate glass (USG), silicon oxide, silicon nitride, silicon oxynitride, or other suitable materials. The dielectric constants (k value) of the low-k dielectric materials may be less than about 3.9, or less than about 2.8. Metal lines in the metallization structure may be formed of copper, copper alloys, or the like.

Figure 2:
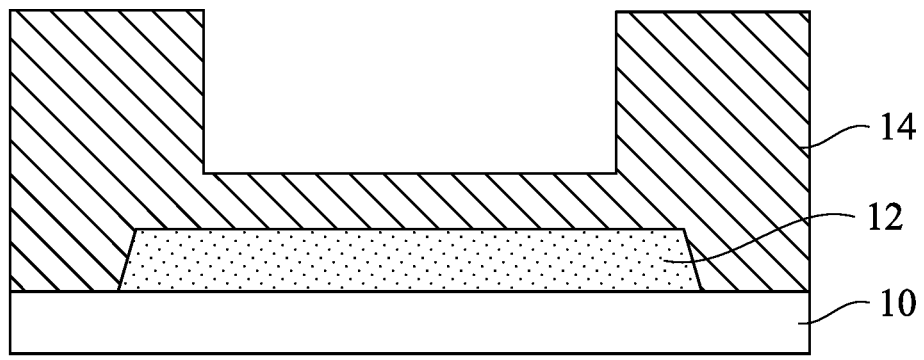
FIGS. 2-8 are cross-sectional views of a portion of a semiconductor device at various stages in a bump formation process in accordance with some embodiments of the instant disclosure.

With reference to FIG. 2, a conductive region 12 and at least one passivation layer 14 are formed over the substrate 10. The conductive region 12 is a metallization layer formed over the inter-layer dielectric layers. The conductive region 12 is a portion of conductive routes and has an exposed surface treated by a planarization process, such as chemical mechanical polishing (CMP), if necessary. Suitable materials for the conductive region 12 may include, but are not limited to, for example copper, aluminium, copper alloys, or other conductive materials, although it may also be formed of, or include, other materials such as silver, gold, nickel, tungsten, alloys thereof, multi-layers thereof, or the like. The conductive region 12 has a width (diameter) ranging between approximately 1 and 10 µm. The term "width" refers to the longest straight line whose endpoints lie on a surface. In some embodiments, the conductive region 12 is a conductive pad 12, which may be used in the bonding process to connect the integrated circuits in the respective chip to external features. The passivation layer 14 is formed on the substrate 10, overlying the conductive pad 12. In some embodiments, the passivation layer 14 includes one or more non-organic layers, such as un-doped silicate glass (USG), silicon nitride, silicon oxynitride, silicon oxide, silicon carbide, aluminium oxide, combinations thereof, multi-layers thereof, or the like, although other dielectric materials can also be used. The passivation layer 14 has a depression recessed toward the conductive pad 12. The passivation layer 14 is thicker on either side of the conductive pad 12, and the thickness of the passivation layer 14 reduces sharply toward the conductive pad 12. The depression of the passivation layer 14 superimposes over the conductive pad 12.

Figure 3:
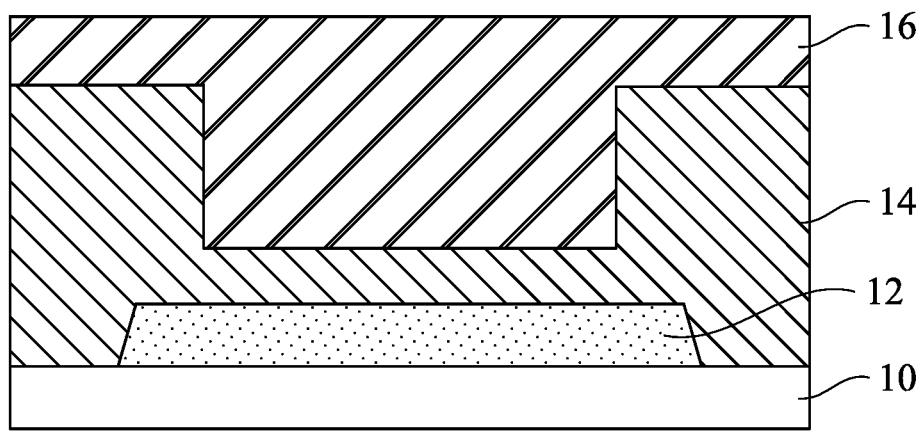

With reference to FIG. 3, a first sacrificial layer 16 is formed on the passivation layer 14. The first sacrificial layer 16 may be formed of an oxide material, such as high aspect ratio process (HARP) oxide, although it may also be formed of other suitable materials.

Figure 4:
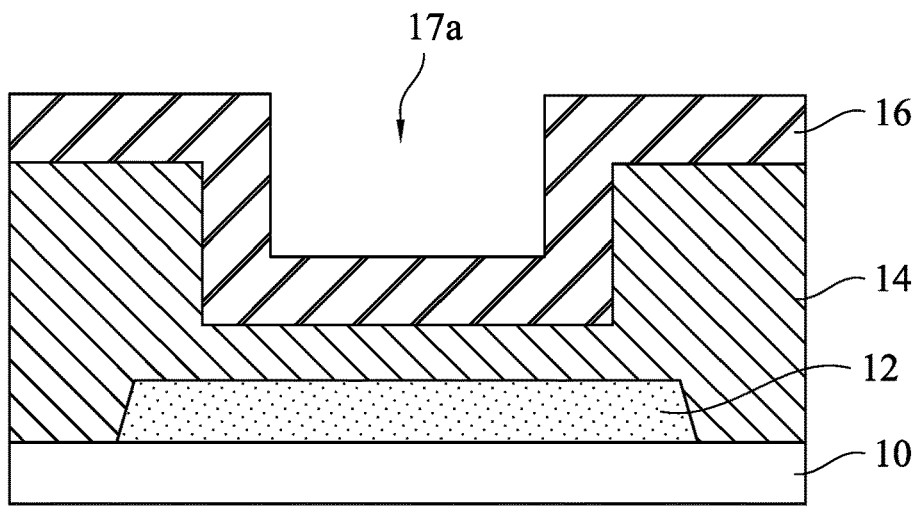

With reference to FIG. 4, the first sacrificial layer 16 is subsequently patterned with a first recess 17a for example, by exposure, development and etching, so that the first recess 17a is superimposed over the conductive pad 12. The first recess 17a has a first diameter that is smaller than a width of the conductive pad 12. A position of the first recess 17a is arranged over the depression of the passivation layer 14. The first recess 17a superimposes the conductive pad 12. The patterned first sacrificial layer 16 covers the entire top surface and the sidewall of the passivation layer 14 without exposing its underlying components.

Figure 5:
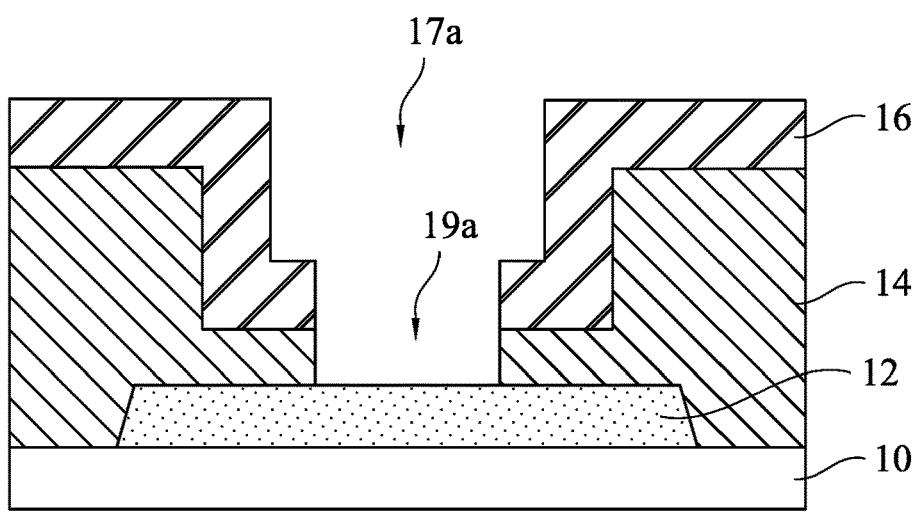

With reference to FIG. 5, the first sacrificial layer 16 and the passivation layer 14 are patterned. A second patterning process involving a photolithography and etching is performed to pattern the first sacrificial layer 16 with a second recess 19a. The second recess 19a goes through the bottom of the first recess 17a and further through the passivation layer 14 so as to expose a portion of the underlying conductive pad 12. The second recess 19a of the first sacrificial layer 16 has a smaller width (diameter) than the first diameter of the first recess 17a. The sidewalls of the first sacrificial layer 16 protrude inwardly to create a narrower second recess 19a. The widths of the first recess 17a and the second recess 19a are different, so that a step-like configuration is formed. An opening structure (including the first recess 17a and the second recess 19a) is formed without identical width. The first recess 17a and the second recess 19a may be substantially concentric, while the difference in width between the first recess 17a and second recess 19a is sufficient to show a step between the two levels. The tread of the step lands on the first recess 17a of the first sacrificial layer 16.

Figure 6:
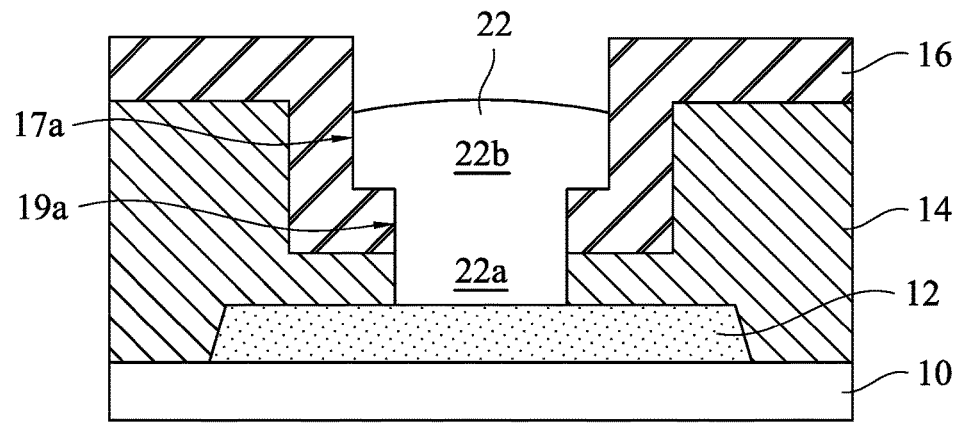

With reference to FIG. 6, a conductive bump 22 is formed over the exposed portion of the conductive pad 12 within the first recess 17a and the second recess 19a. The conductive bump 22 is made of, for example, nickel, nickel alloys, combinations thereof, or the like. The conductive bump 22 may be formed by an electro-less (E-less) plating process or the like. The conductive bump 22 has a bottom portion 22a and a top portion 22b. The bottom portion 22a fills in the second recess 19a, and the top portion 22b refers to the conductive bump 22 within the first recess 17a. The bottom portion 22a is over the conductive pad 12. The top portion 22b is over the bottom portion 22a. A thickness of the top portion 22b does not exceed the depth of the first recess 17a. The top surface of the top portion 22b is lower than a top surface of the first sacrificial layer 16. The passivation layer 14 surrounds the conductive bump 22. The conductive bump 22 resembles a wine stopper or a mushroom having a neck portion (bottom portion 22a) and a cap portion (top portion 22b). The width of the conductive bump 22 inherits the widths of the first and second recesses 17a and 19a respectively. The bottom portion 22a has a smaller width in comparison with the top portion 22b. The outskirt bottom surface of the top portion 22b lands on the first recess 17a of the first sacrificial layer 16. The top portion 22b protrudes laterally with respect to the bottom portion 22a.

Figure 7:
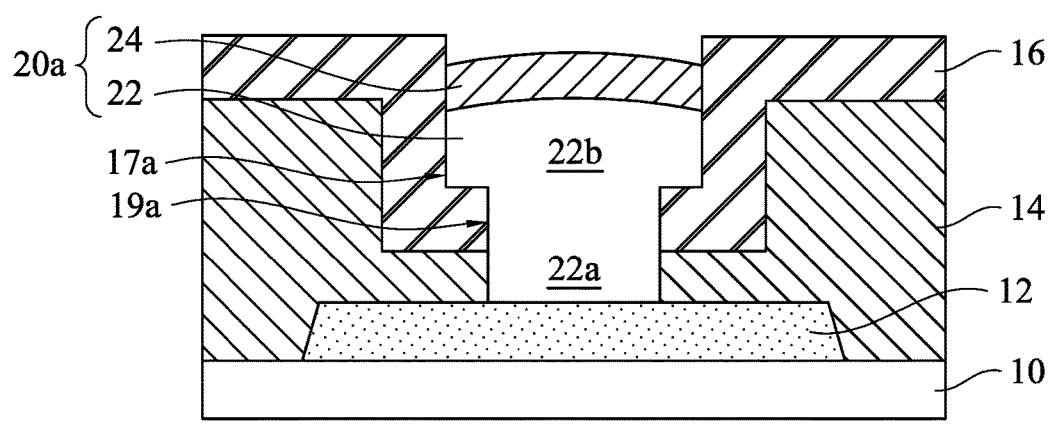

With reference to FIG. 7, a conductive cap 24 is formed over the conductive bump 22. The conductive cap 24 fills in a portion of the first recess 17a and has similar width as the top portion 22b of the conductive bump 22. The formation method of the conductive cap 24 may include an electro-less plating method or the like. The conductive cap 24 may include gold (Au), silver, palladium (Pd), nickel-palladium-gold (NiPdAu), nickel-gold (NiAu) or other suitable materials or alloys. The micro bump 20a of the semiconductor device includes the conductive bump 22 and the conductive cap 24. The micro bump 20a is not a straight pillar but has different widths at different portion. For example, the micro bump 20a has a narrow neck portion (bottom portion 22a)

and broader head portion (top portion 22b and conductive cap 24). The sidewall surfaces of the micro bump 20a shows step-like contour with a bottom portion 22a narrower than the top portion 22b and the conductive cap 24.

Still referring to FIG. 7, impurity control of the conductive pad 12 and the conductive cap 24 has pivotal effects on contact resistance. The passivation layer 14 and the first sacrificial layer 16 are not metallic materials. When the conductive bump 22 and the conductive cap 24 fill in the first recess 17a and the second recess 19a, the adhesion between the non-metal materials (i.e., the passivation layer 14 and the first sacrificial layer 16) and the metal ones (i.e., the conductive bump 22 and the conductive cap 24) is poor. The poor adhesion results in gap formation. These gaps are likely to be formed at the interface for example, in which the top portion 22b meets the first sacrificial layer 16. Because the micro bump 20a is formed with different widths, the gaps therefore wind in a zigzag fashion.

When forming the conductive cap 24, the conductive cap 24 may sneak its way along the gaps towards the conductive pad 12. A diffusion path may be paved between the conductive pad 12 and the conductive cap 24. The zigzag path inhibits unwanted stretching of the conductive cap 24. The stepped sidewall surfaces of the conductive bump 22 create a longer, if not unattainable, route to the conductive cap 24. In the subsequent thermal process for example, annealing, material exchange between the conductive pad 12 and the conductive cap 24 is less likely to occur. For example, when the conductive pad 12 is made of copper (Cu) and the conductive cap 24 made of gold (Au), a portion of the gold may negotiate through the narrow gaps between the conductive bump 22 and the first sacrificial layer 16 (and passivation layer 14). This diffusion path may be cut short because of the sharp turn of the step arisen out of different conductive bump 22 widths. During subsequent thermal process, copper from the conductive pad 12 cannot travel to the conductive cap 24 through the disconnected diffusion path. The conductive cap 24 is then protected from foreign material contamination. In the case of copper contamination, a faster oxidation rate of copper causes adverse effect to the gold and its counterpart. A contaminated conductive cap will have a higher contact resistance when its counterpart is bonded to the conductive cap.

Figure 8:
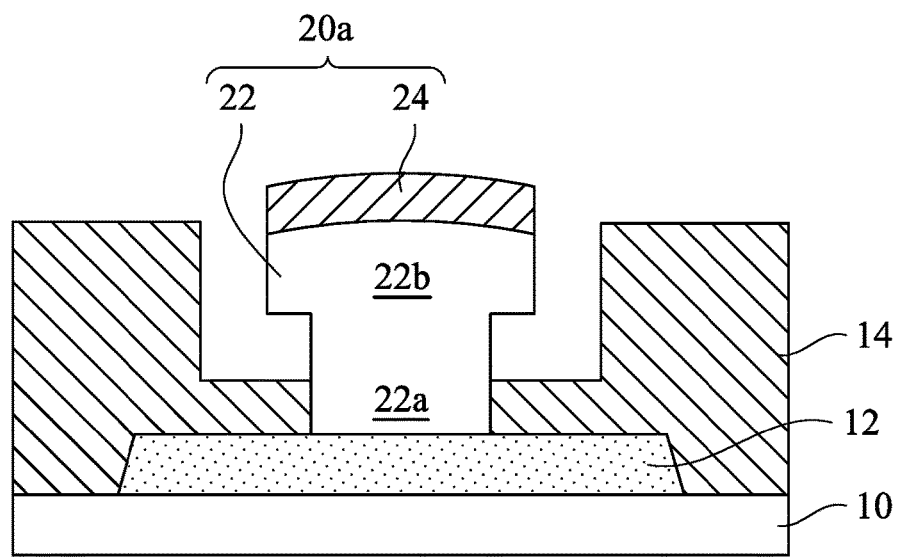

With reference to FIG. 8, the first sacrificial layer 16 is removed. Thus, the passivation layer 14 is exposed, and the conductive cap 24 of the micro bump 20a protrudes over the passivation layer 14. A top surface of the conductive cap 24 is in a position higher than a top surface of the passivation layer 14. The conductive cap 24 is the bonding spot with its counterpart. The top portion 22b of the conductive bump 22 is spaced apart from the passivation layer 14, and a portion of the bottom portion 22a rises above the depression of the passivation layer 14. In some embodiments, the micro bump 20a has a first portion and a second portion. The first portion refers to the bottom portion 22a of the conductive bump 22, and the second portion refers to the top portion 22b and the conductive cap 24. The first portion and the second portion have different widths, and therefore a micro bump 20a with a stepped sidewall profile is created.

The structure shown in FIG. 8 may be attached to another substrate. The substrate may be glass of a display device or other suitable substrate. The micro bump 20a contacts a contact pad and/or a conductive trace on the substrate through, for example, a metal layer. The metal layer may include a metal with a low melting point such as indium, indium alloys, or the like. Using an exemplary coupling process including chip placement and thermo-compression bonding, a metal joint structure is formed between the two substrates.

Figure 9:
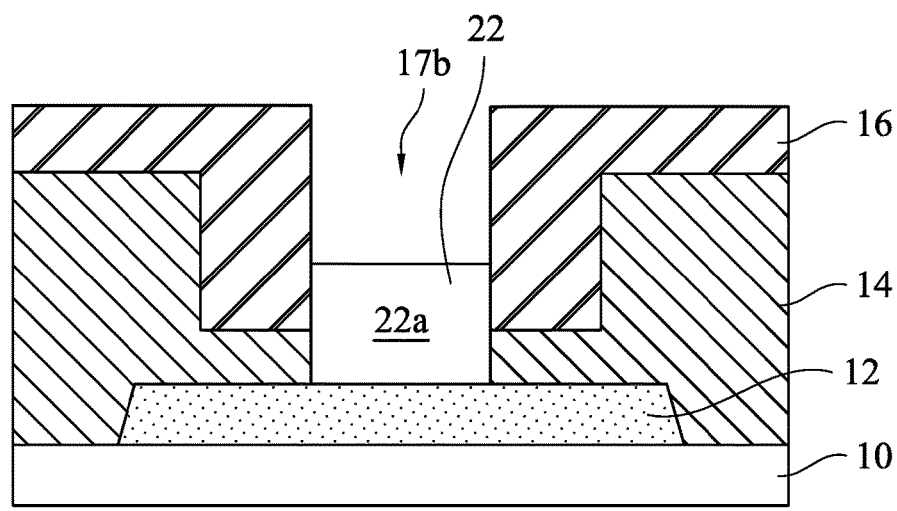
FIGS. 9 and 10 are cross-sectional views of a portion of a semiconductor device at an intermediate stage of a bump formation process in accordance with some embodiments of the instant disclosure.

With reference to FIG. 9, in alternative embodiments, after the deposition of the first sacrificial layer 16 shown in FIG. 3, the first sacrificial layer 16 is patterned to form a first recess 17b. The first recess 17b goes through the first sacrificial layer 16 and the passivation layer 14. The first recess 17b exposes a portion of the conductive pad 12. The bottom portion 22a of the conductive bump 22 is formed over the exposed portion of the conductive pad 12 within the first recess 17b. Unlike the method shown in FIG. 4, a portion of the conductive bump 22 is formed first.

Figure 10:
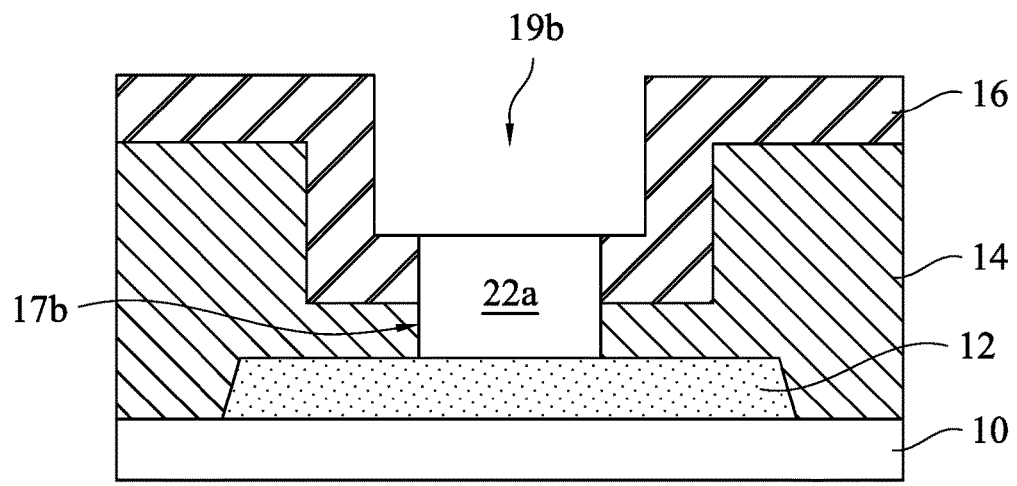

With reference to FIG. 10, the first sacrificial layer 16 undergoes a second patterning process to form a second recess 19b. The second recess 19b has a larger width than the first recess 17b. The second recess 19b is defined by the sidewalls of the first sacrificial layer 16 and top surface of the bottom portion 22a. After the second recess 19b is formed, the top portion 22b is then formed over the bottom portion 22a as shown in FIG. 6. The conductive cap 24 is next formed on the top portion 22b shown in FIG. 7 similar to previously described.

Figure 11:
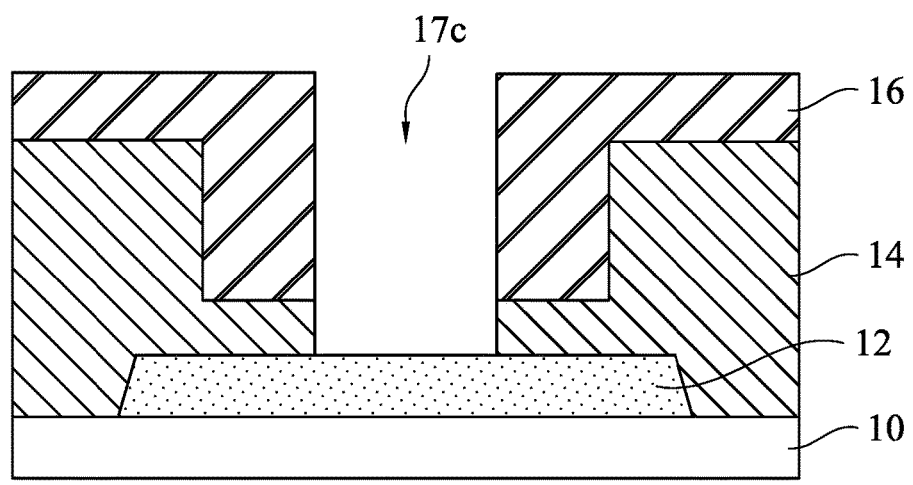
FIGS. 11-20 are cross-sectional views of a portion of a semiconductor device at an intermediate stage of a bump formation process in accordance with some embodiments of the instant disclosure.

With reference to FIG. 11, in alternative embodiments, after the deposition of the first sacrificial layer 16 shown in FIG. 3, the first sacrificial layer 16 is patterned to form a first recess 17c. The first recess 17c goes through the first sacrificial layer 16 and the passivation layer 14. The first recess 17c exposes a portion of the conductive pad 12.

Figure 12:
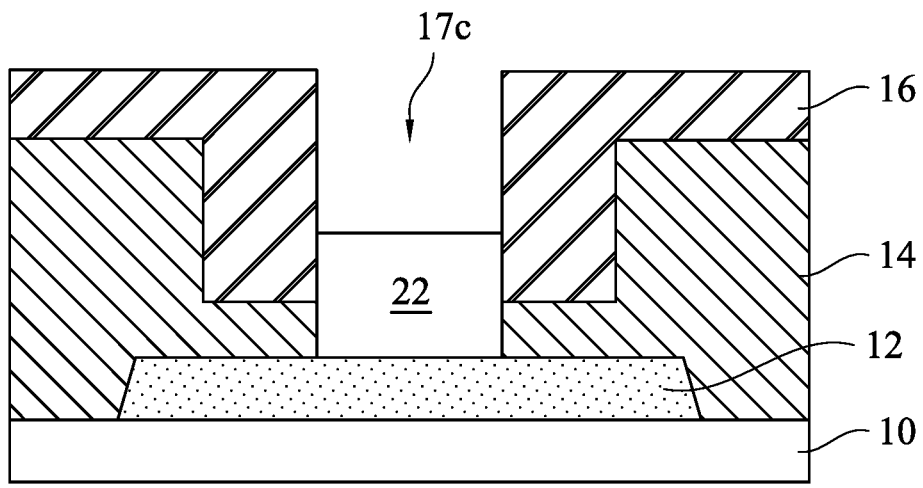

With reference to FIG. 12, the conductive bump 22 is formed over the exposed portion of the conductive pad 12 within the first recess 17c. The top surface of the conductive bump 22 is lower than the opening of the first recess 17c. The conductive bump 22 has a thickness spans across the interface between the first sacrificial layer 16 and the passivation layer 14 in the first recess 17c. The conductive bump 22 has the same width as the first recess 17c.

Figure 13:
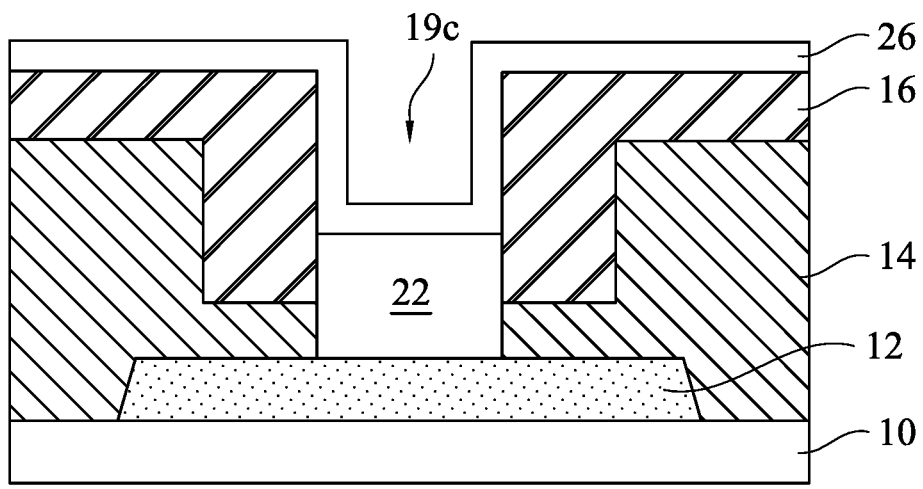

With reference to FIG. 13, a second sacrificial layer 26 is conformally formed on the first sacrificial layer 16 and the conductive bump 22. The second sacrificial layer 26 covers the top surface and sidewalls of the first sacrificial layer 16. The second sacrificial layer 26 also covers up the conductive bump 22 in the first recess 17c (shown in FIG. 12). The contour of the first recess 17c (shown in FIG. 12) is partially reproduced by the second sacrificial layer 26 but with a narrower opening because the second sacrificial layer 26 has a thickness that occupies the volume of the first recess 17c (shown in FIG. 12) to produce a second recess 19c with a different width. For example, if the first recess 17c (shown in FIG. 12) has a width of approximately 7 μm. After the deposition of the second sacrificial layer 26, the second recess 19c has a width of approximately 4 μm because the second sacrificial layer 26 occupies a volume of the first recess 17c (shown in FIG. 12).

Figure 14:
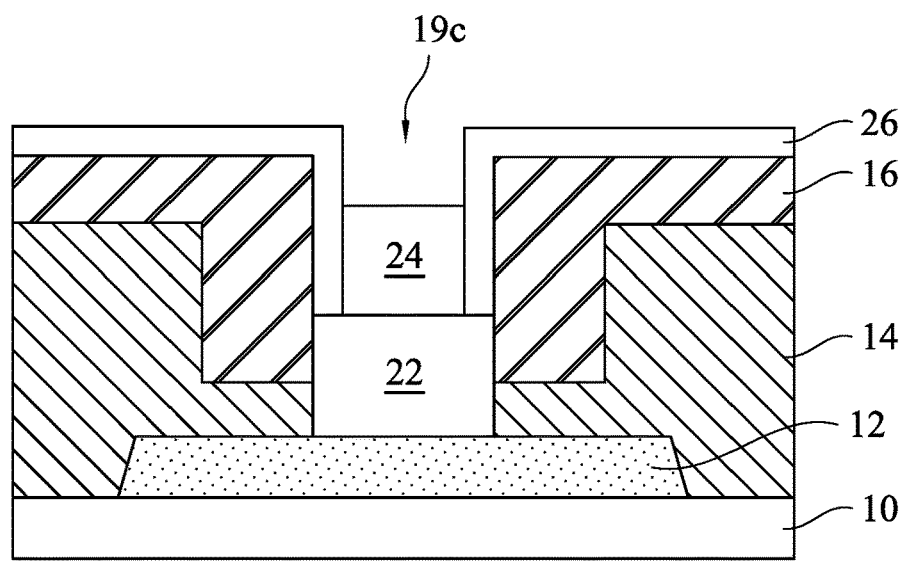

With reference to FIG. 14, a bottom portion of the second sacrificial layer 26 is removed. The bottom portion of the second sacrificial layer 26 is located on the top surface of the conductive bump 22. A portion of the top surface of the conductive bump 22 is exposed by the removal of the bottom portion of the second sacrificial layer 26. Because the second sacrificial layer 26 on the sidewalls of the first sacrificial layer 16 remains, the remaining portion of the top surface of the conductive bump 22 is covered by the second sacrificial layer 26 as shown in FIG. 14. Subsequently, the conductive cap 24 is formed in the second recess 19c on the conductive bump 22. The conductive cap 24 has a width the same as the second recess 19c but smaller than the width of the conductive bump 22.

Figure 15:
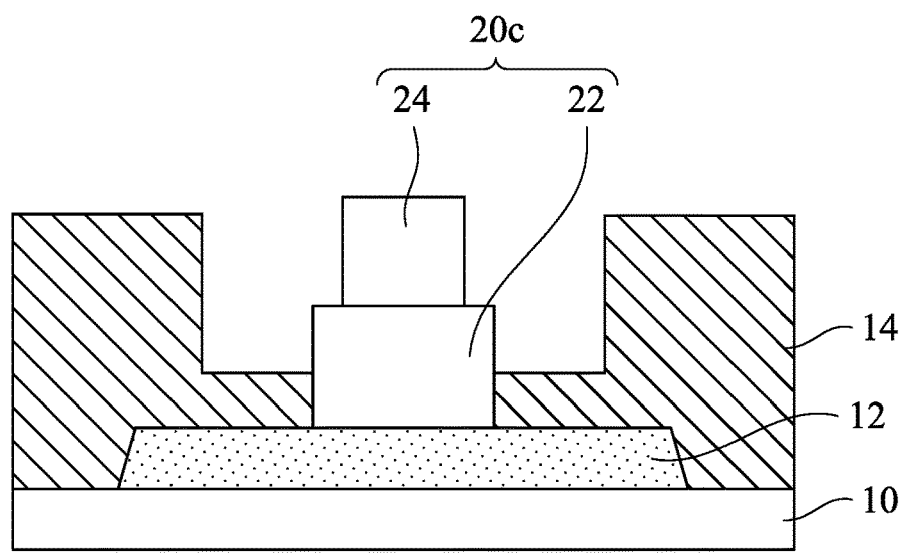

With reference to FIG. 15, the first and second sacrificial layers 16 and 26 are removed to form the micro bump 20c. The conductive bump 22 has a substantially identical width. The conductive bump 22 has a height exceeds a bottom surface of the depression of the passivation layer 14. The stepped sidewall surfaces arise at the level in which the conductive cap 24 and the conductive bump 22 meet because the conductive bump 22 has a different width from the conductive cap 24 due to the first and second recesses 17c (shown in FIG. 11) and 19c (shown in FIG. 13). The conductive cap 24 has a smaller width than the conductive bump 22. A portion of the conductive bump 22 is exposed from the conductive cap 24. The top surface of the conductive bump 22 forms a ring surrounding the conductive cap 24 in a plan view. In some embodiments, the micro bump 20c has a first portion and a second portion. The first portion refers to the conductive bump 22, and the second portion refers to the conductive cap 24. The first portion and the second portion have different widths, and therefore a micro bump 20c with a stepped sidewall profile is created.

Figure 16:
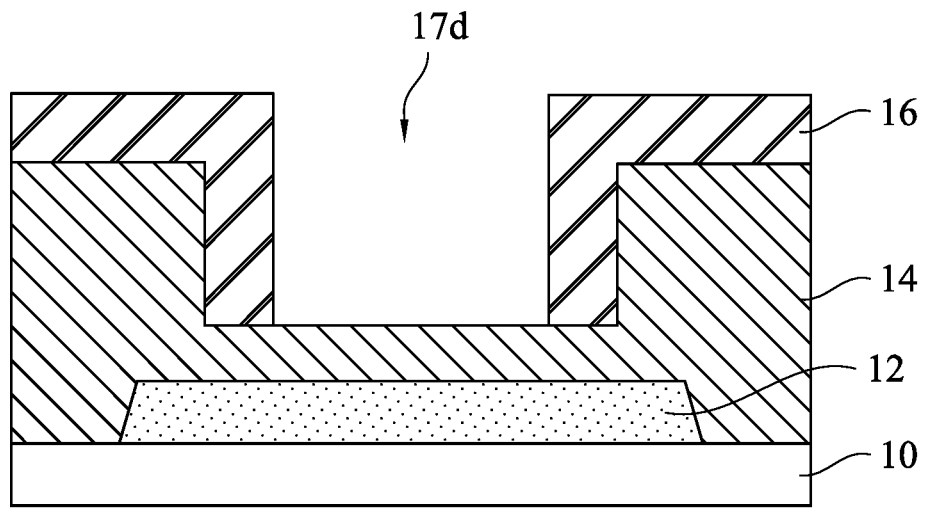

With reference to FIG. 16, in alternative embodiments, the first sacrificial layer 16 is patterned with a first recess 17d. The first recess 17d is superimposed over the conductive pad 12. The first recess 17d patterning process stops when the underlying passivation layer 14 is exposed. The first recess 17d has a first diameter that is smaller than a width of the conductive pad 12.

Figure 17:
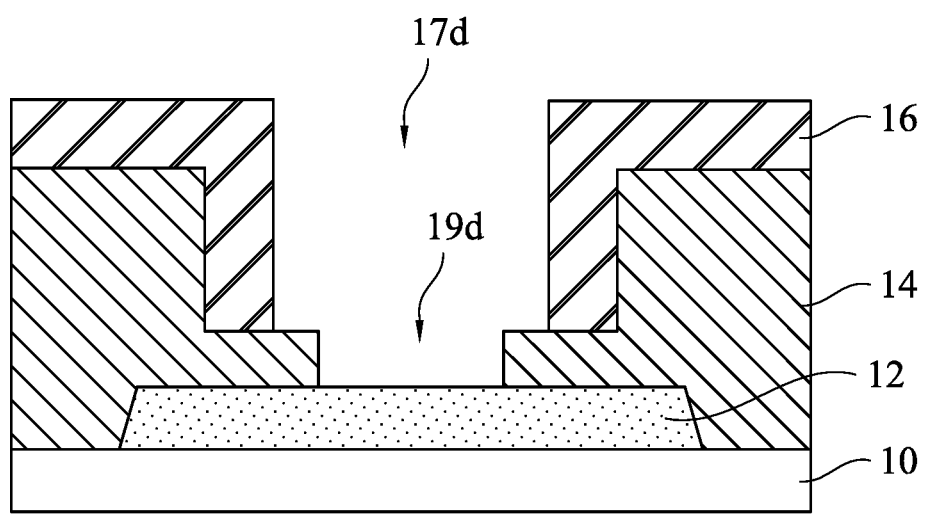

With reference to FIG. 17, the passivation layer 14 is patterned. A second patterning process involving a photolithography and etching is performed to pattern the passivation layer 14 with a second recess 19d. The second recess 19d goes through the passivation layer 14 so as to expose a portion of the underlying conductive pad 12. The second recess 19d of the passivation layer 14 has a smaller width (diameter) than the first diameter of the first recess 17d. The sidewalls of the passivation layer 14 protrude inwardly to create a narrower second recess 19d. The widths of the first recess 17d and the second recess 19d are different, so that a step-like configuration is formed. Unlike the structure shown in FIG. 5, the tread of the step lands on the second recess 19d of the passivation layer 14. The second recess 19d is shallower than the first recess 17d.

Figure 18:
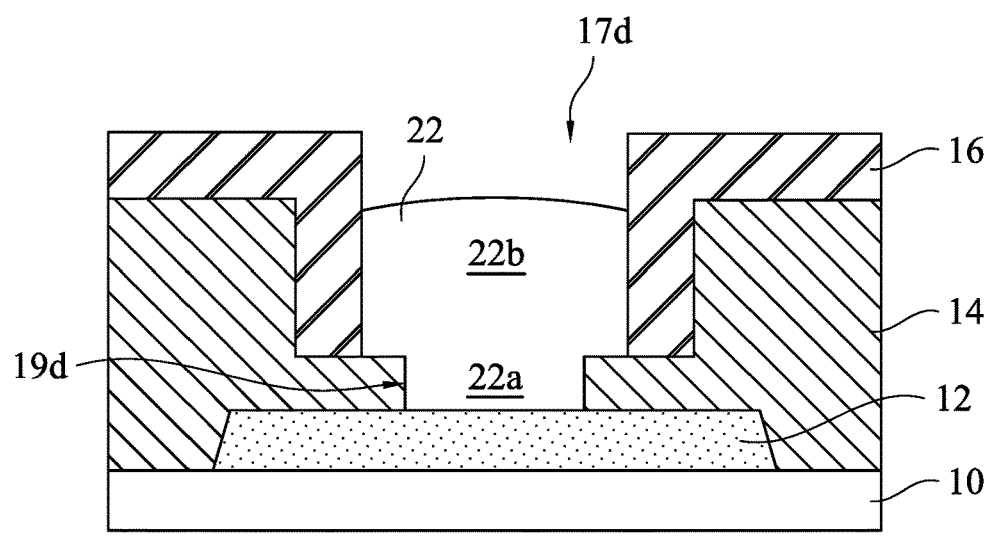

With reference to FIG. 18, a conductive bump 22 is formed over the exposed portion of the conductive pad 12 within the first recess 17d and the second recess 19d. The conductive bump 22 has a bottom portion 22a and a top portion 22b. The bottom portion 22a fills in the second recess 19d, and the top portion 22b refers to the conductive bump 22 within the first recess 17d. The bottom portion 22a has a smaller width in comparison with the top portion 22b. In addition, the bottom portion 22a is thinner than the top portion 22b. The outskirt bottom surface of the top portion 22b lands on the passivation layer 14. The top portion 22b is thicker than and in contact with the passivation layer 14.

Figure 19:
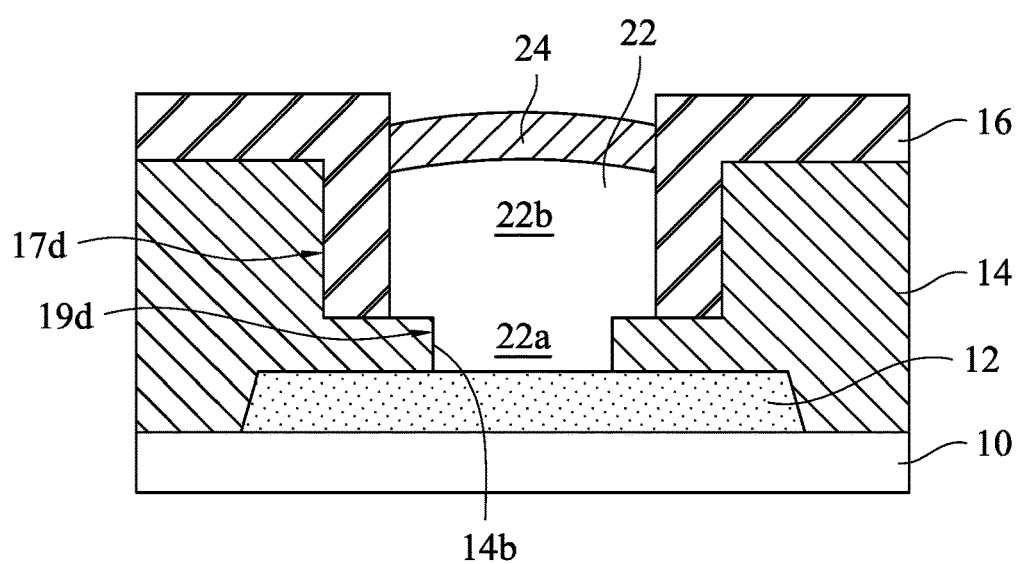

With reference to FIG. 19, a conductive cap 24 is formed on the conductive bump 22. The conductive cap 24 fills in a portion of the first recess 17d and has similar width as the top portion 22b of the conductive bump 22.

Figure 20:
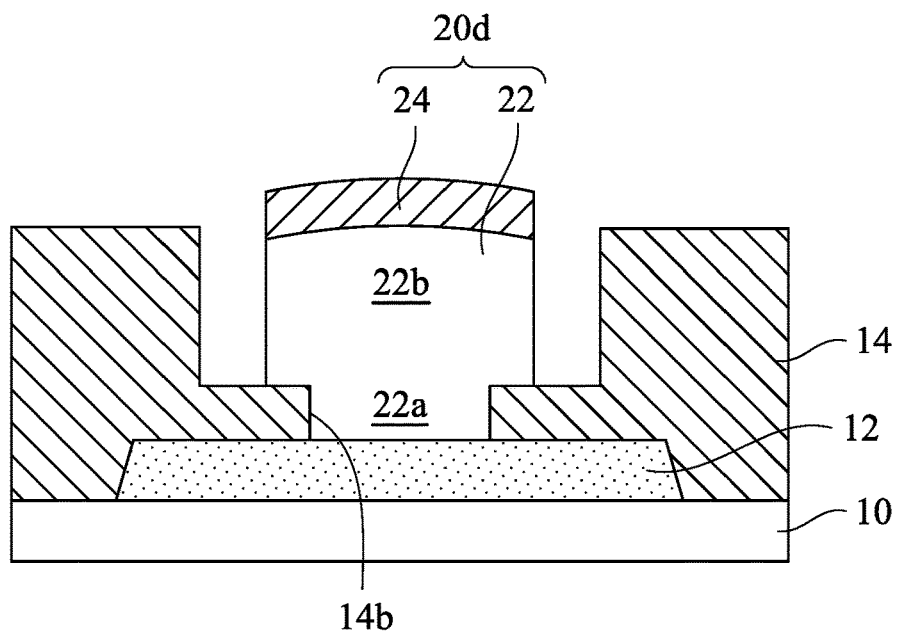
Figure 21:
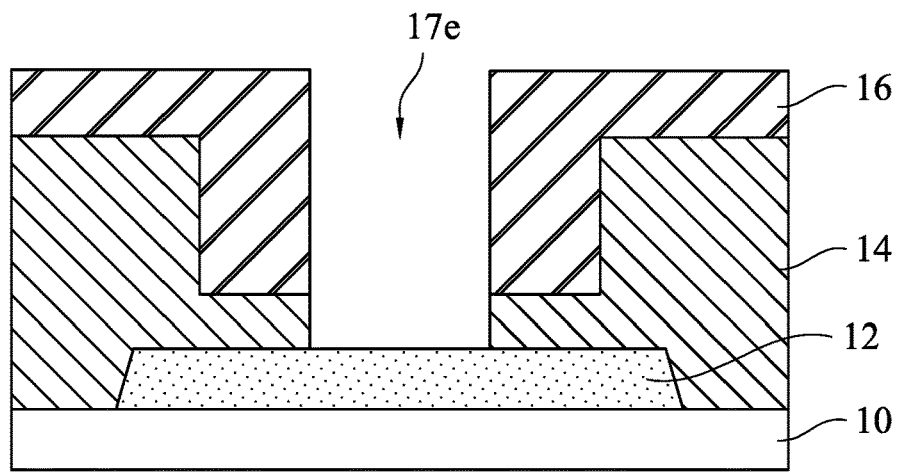
FIGS. 21-27 are cross-sectional views of a portion of a semiconductor device at an intermediate stage of a bump formation process in accordance with some embodiments of the instant disclosure.

With reference to FIG. 20, the first sacrificial layer 16 is removed to form the micro bump 20d. Difference between the micro bump 20a (shown in FIG. 8) and the micro bump 20d arises from the proportion of the bottom portion 22a and top portion 22b of the conductive bump 22. As shown in FIG. 21, the bottom portion 22a is thinner than the top portion 22b and enclosed by the passivation layer 14. The top portion 22b adheres to the top surface of the passivation layer 14. In some embodiments, the micro bump 20d has a first portion and a second portion. The first portion refers to the bottom portion 22a of the conductive bump 22, and the second portion refers to the top portion 22b and the conductive cap 24. The first portion and the second portion have different widths, and therefore a micro bump 20d with a stepped sidewall profile is created.

With reference to FIG. 21, in alternative embodiments, after the deposition of the first sacrificial layer 16 shown in FIG. 3, the first sacrificial layer 16 is patterned to form a first recess 17e. The first recess 17e goes through the first sacrificial layer 16 and the passivation layer 14. The first recess 17e exposes a portion of the conductive pad 12.

Figure 22:
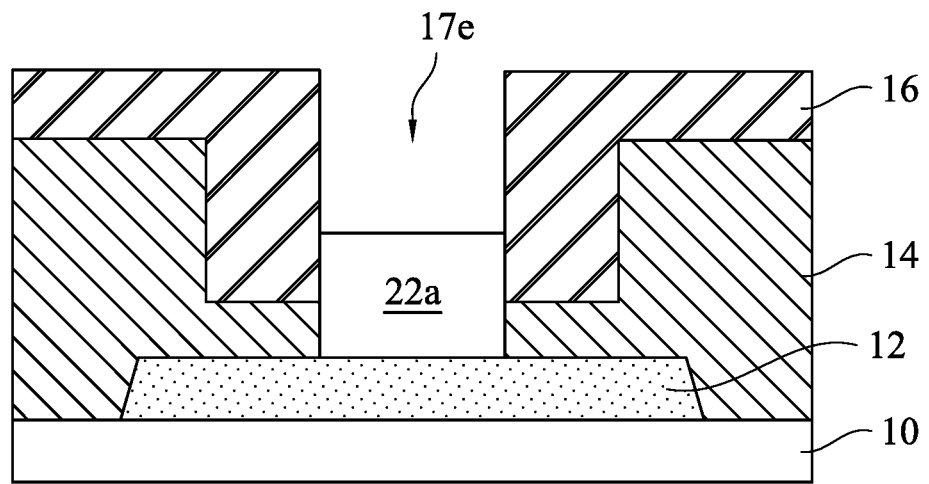

With reference to FIG. 22, the bottom portion 22a of the conductive bump 22 is formed over the exposed portion of the conductive pad 12 within the first recess 17e. The top surface of the bottom portion 22a is lower than the opening of the first recess 17e. The conductive bump 22 has a thickness spans across the interface between the first sacrificial layer 16 and the passivation layer 14 in the first recess 17c. The bottom portion 22a has the same width as the first recess 17e.

Figure 23:
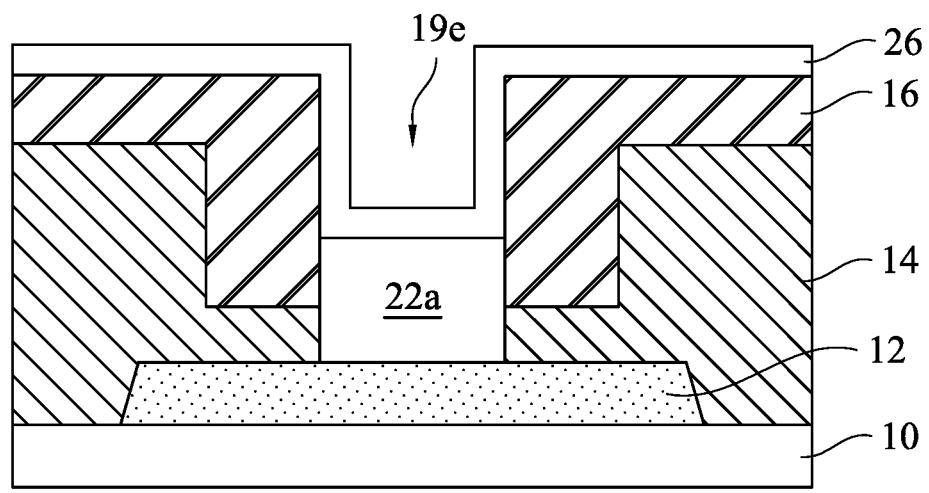

With reference to FIG. 23, a second sacrificial layer 26 is conformally formed on the first sacrificial layer 16 and the bottom portion 22a. The second sacrificial layer 26 covers the top surface and sidewalls of the first sacrificial layer 16. The second sacrificial layer 26 also covers up the bottom portion 22a in the first recess 17e (shown in FIG. 22). The contour of the first recess 17e (shown in FIG. 22) is partially reproduced by the second sacrificial layer 26 but with a narrower opening because the second sacrificial layer 26 has a thickness that occupies the volume of the first recess 17e (shown in FIG. 22) to produce a second recess 19e with a different width.

Figure 24:
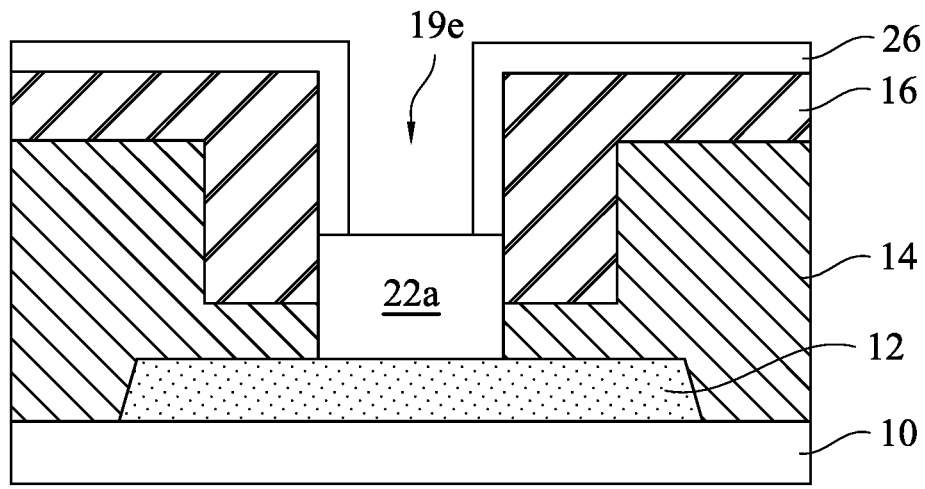

With reference to FIG. 24, a bottom portion of the second sacrificial layer 26 is removed. The bottom portion of the second sacrificial layer 26 is located on the top surface of the bottom portion 22a. A portion of the top surface of the bottom portion 22a is exposed by the removal of the bottom portion of the second sacrificial layer 26. Because the second sacrificial layer 26 on the sidewalls of the first sacrificial layer 16 remains, the remaining portion of the top surface of the bottom portion 22a is covered by the second sacrificial layer 26 as shown in FIG. 24.

Figure 25:
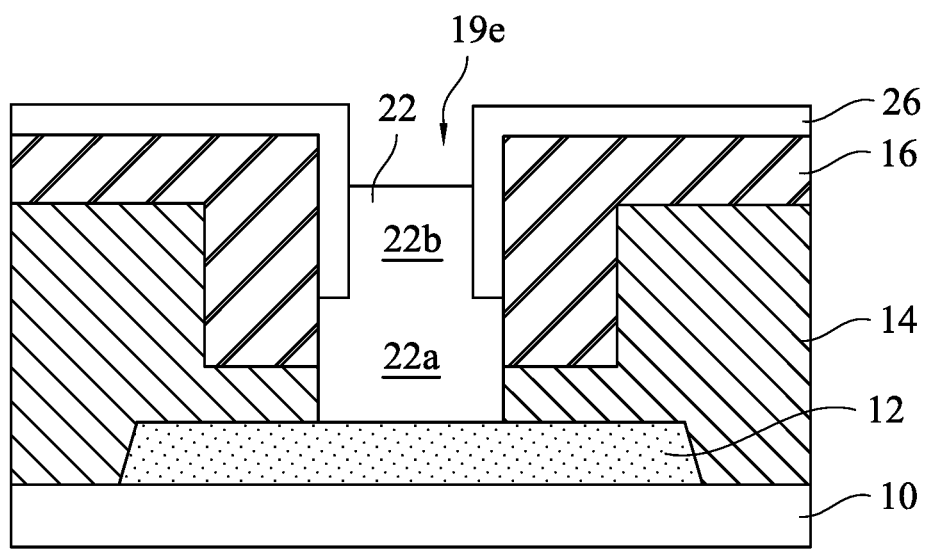

With reference to FIG. 25, subsequently the top portion 22b of the conductive bump 22 is formed in the second recess 19e. The top portion 22b has the same width as the second recess 19e, while the top portion 22b has a smaller width than the bottom portion 22a. From a plan view, the bottom portion 22a forms a ring encircling the top portion 22b. The conductive bump 22 has a step-like configuration, and the tread lands on the bottom portion 22b.

Figure 26:
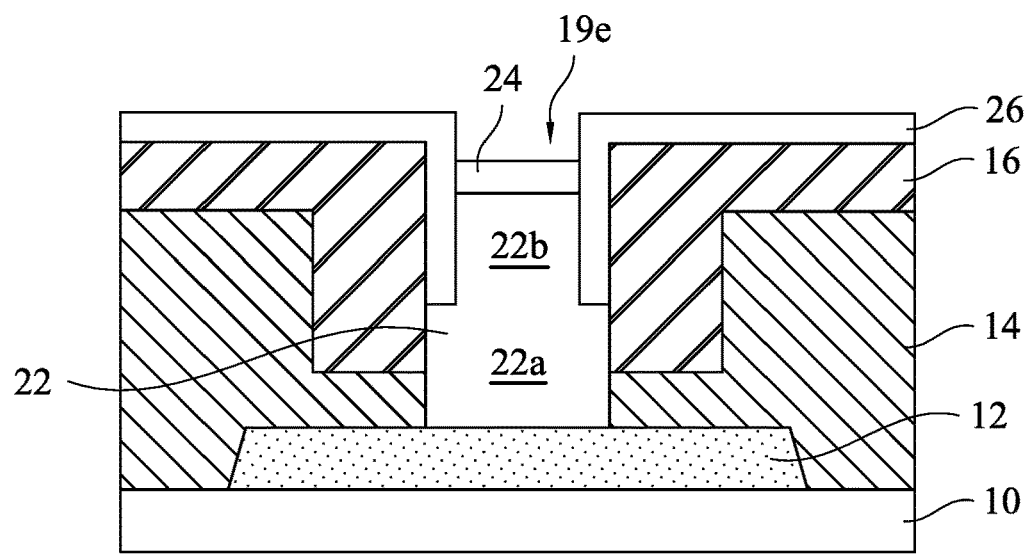

With reference to FIG. 26, the conductive cap 24 is formed in the second recess 19e on the top portion 22b of the conductive bump 22. The conductive cap 24 has a width the same as the second recess 19e but smaller than the width of the bottom portion 22a.

Figure 27:
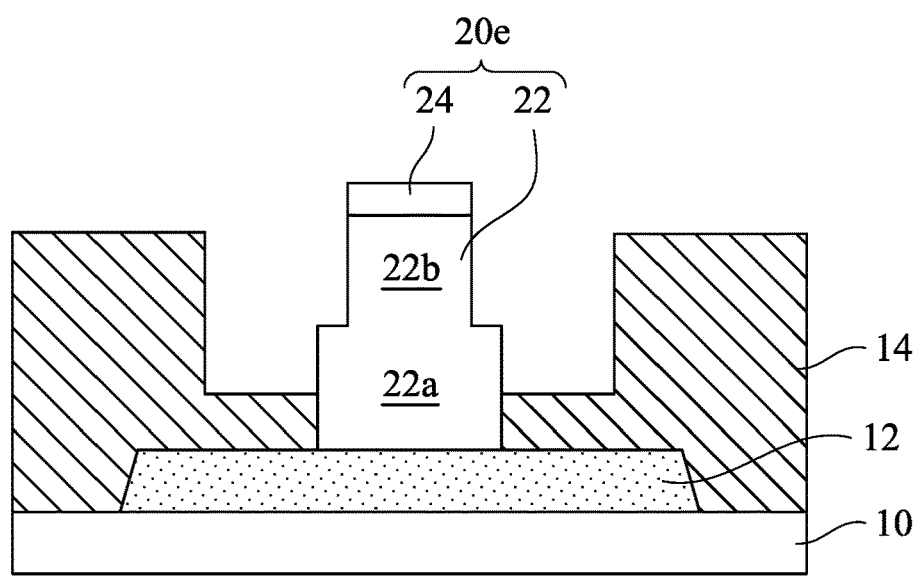

With reference to FIG. 27, the first and second sacrificial layers 16 and 26 are removed to form the micro bump 20e. The micro bump 20e has a broad waist (bottom portion 22a) and a narrower body (top portion 22b and conductive cap 24). The step is created at the interface of the top portion 22b and the bottom portion 22a. The micro bump 20e may be seen as an inverted mushroom with its cap (bottom portion 22a) in contact with the conductive pad 12 and stalk (top portion 22b and conductive cap 24) pointing out. In some embodiments, the micro bump 20e has a first portion and a second portion. The first portion refers to the bottom portion 22a of the conductive bump 22, and the second portion refers to the top portion 22b and the conductive cap 24. The first portion and the second portion have different widths, and therefore a micro bump 20e with a stepped sidewall profile is created.

Figure 28:
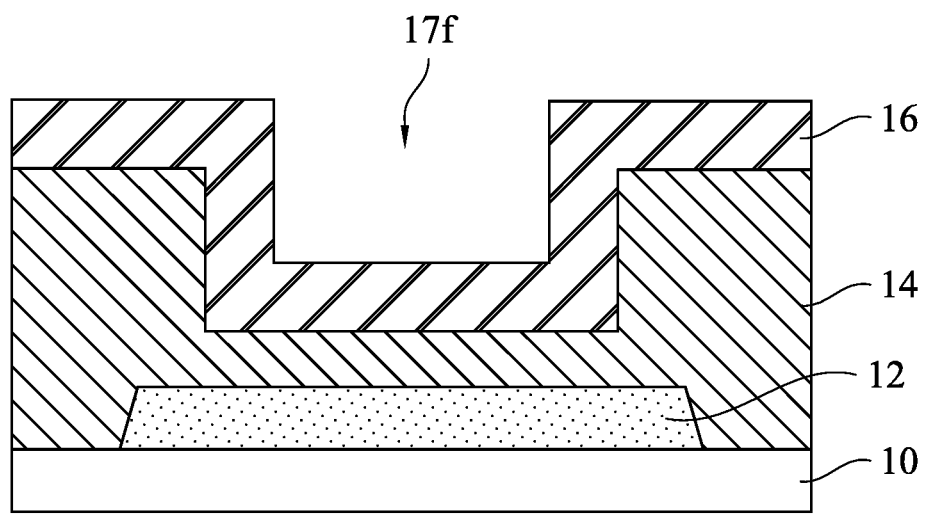
FIGS. 28-34 are cross-sectional views of a portion of a semiconductor device at an intermediate stage of a bump formation process in accordance with some embodiments of the instant disclosure.

With reference to FIG. 28, in alternative embodiments, the first sacrificial layer 16 is patterned with a first recess 17f. The first recess 17f has a first diameter that is smaller than a width of the conductive pad 12. The formation of the first recess 17f does not expose its underlying passivation layer 14.

Figure 29:
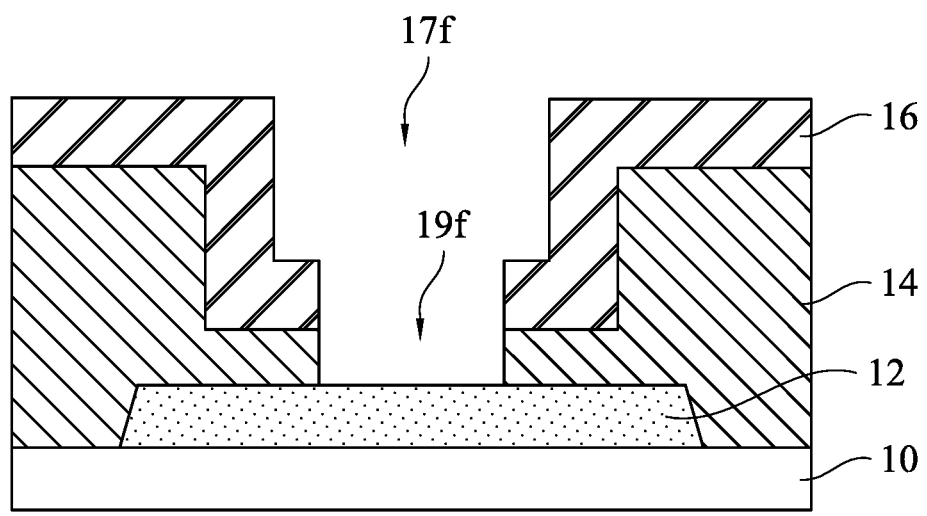

With reference to FIG. 29, the first sacrificial layer 16 and the passivation layer 14 are patterned. A second patterning process involving a photolithography and etching is performed to pattern the first sacrificial layer 16 with a second recess 19f. The second recess 19f goes through the bottom of the first recess 17f and further through the passivation layer 14 so as to expose a portion of the underlying conductive pad 12. The second recess 19f of the first sacrificial layer 16 has a smaller width (diameter) than the first diameter of the first recess 17f. The sidewalls of the first sacrificial layer 16 protrude inwardly to create a narrower second recess 19f. The widths of the first recess 17f and the second recess 19f are different, such that a step-like configuration is formed.

Figure 30:
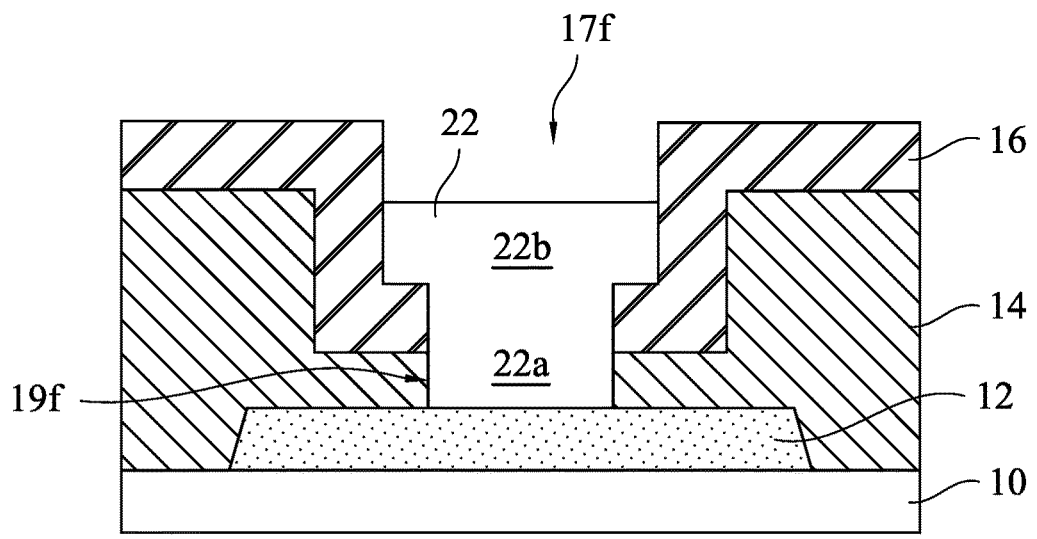

With reference to FIG. 30, a conductive bump 22 is formed over the exposed portion of the conductive pad 12 within the first recess 17f and the second recess 19f. The conductive bump 22 has a bottom portion 22a and a top portion 22b. The bottom portion 22a fills in the second recess 19f, and the top portion 22b refers to the conductive bump 22 within the first recess 17f. The top surface of the top portion 22b is lower than a top surface of the first sacrificial layer 16.

Figure 31:
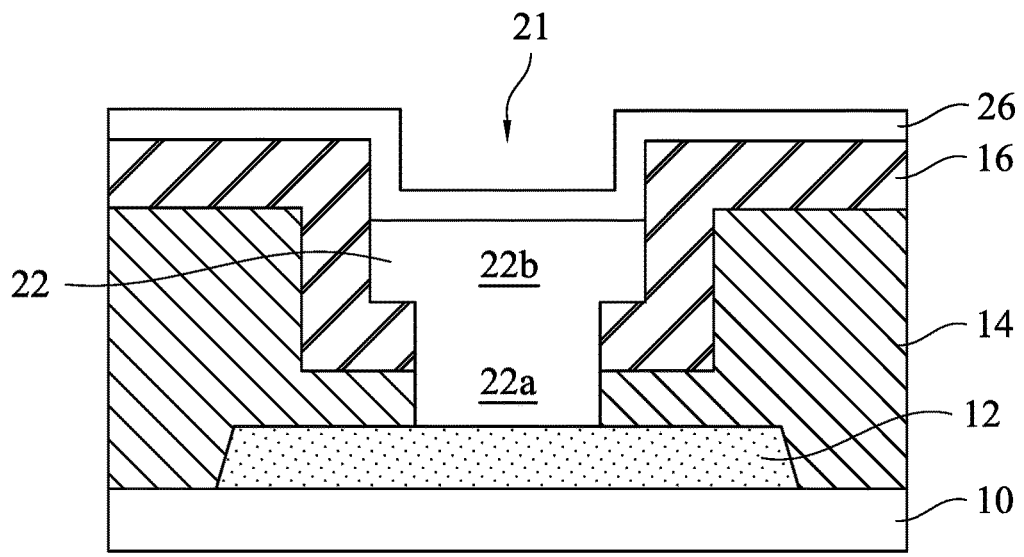

With reference to FIG. 31, a second sacrificial layer 26 is conformally formed on the first sacrificial layer 16 and the conductive bump 22. The second sacrificial layer 26 covers the top surface and sidewalls of the first sacrificial layer 16. The second sacrificial layer 26 also covers up the top portion 22b in the first recess 17f (shown in FIG. 30). The contour of the first recess 17f (shown in FIG. 30) is partially reproduced by the second sacrificial layer 26 but with a narrower opening because the second sacrificial layer 26 has a thickness that occupies the volume of the first recess 17f (shown in FIG. 30) to produce a third recess 21 with a different width from the first recess 17f (shown in FIG. 30). In some embodiments, the third recess 21 may have substantially the same width as the second recess 19f (shown in FIG. 30). In some embodiments, the widths of the first, second and third recesses 17f (shown in FIG. 30), 19f (shown in FIG. 30) and 21 are different from each other. The third recess 21 does not have the same width as the first recess 17f (shown in FIG. 30).

Figure 32:
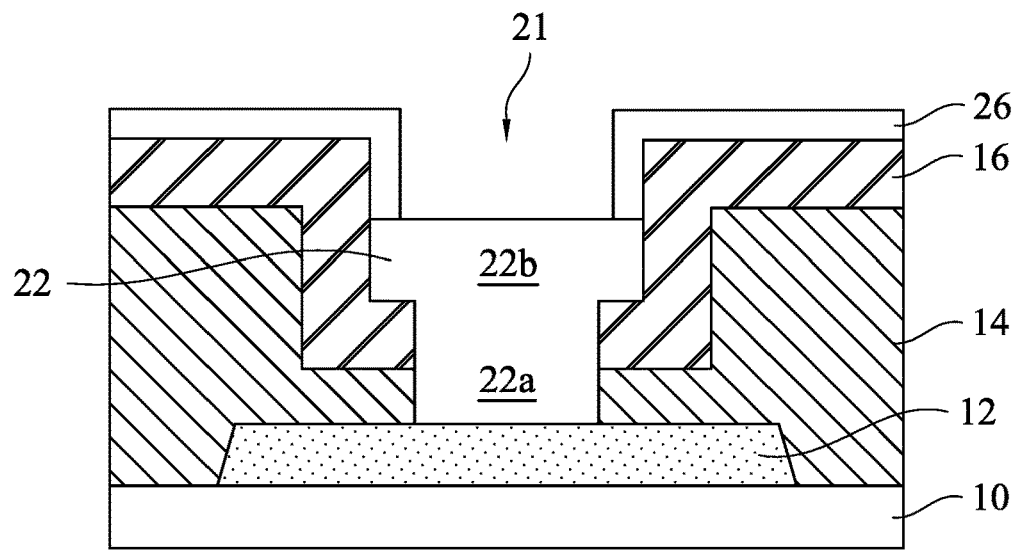

With reference to FIG. 32, a bottom portion of the second sacrificial layer 26 is removed. The bottom portion of the second sacrificial layer 26 is located on the top surface of the top portion 22b of the conductive bump 22. A portion of the top surface of the bottom portion 22a is exposed by the removal of the bottom portion of the second sacrificial layer 26. Because the second sacrificial layer 26 on the sidewalls of the first sacrificial layer 16 remains, the remaining portion of the top surface of the top portion 22b is covered by the second sacrificial layer 26 as shown in FIG. 33.

Figure 33:
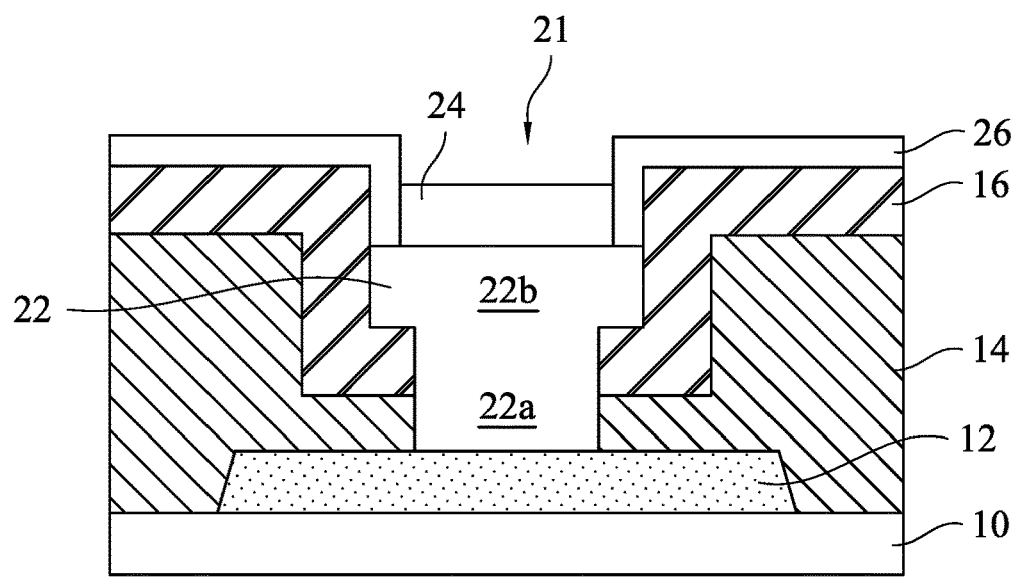

With reference to FIG. 33, the conductive cap 24 is formed in the third recess 21 on the top portion 22b of the conductive bump 22.

Figure 34:
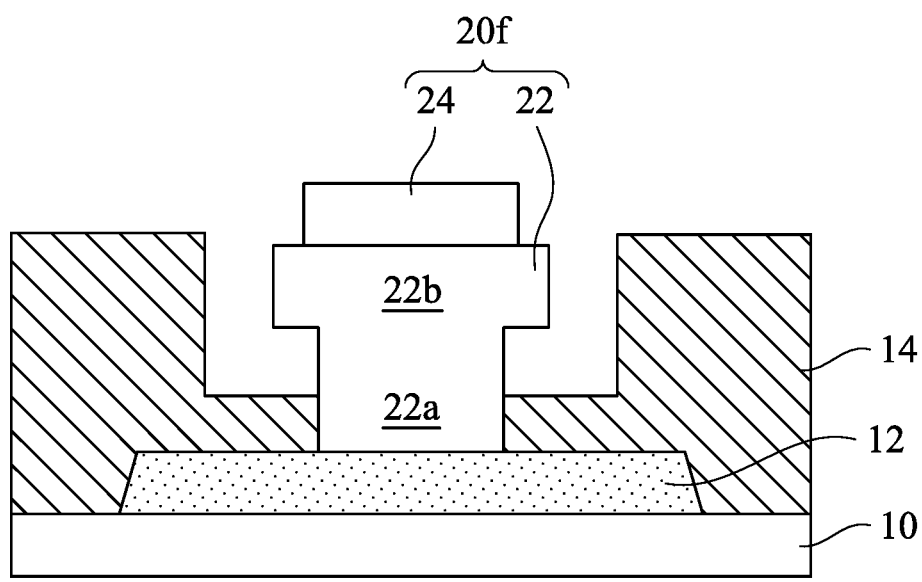

With reference to FIG. 34, the first and second sacrificial layers 16 and 26 are removed to form the micro bump 20f. The micro bump 20f has multi-step configuration. The conductive bump 22 retains its mushroom-like configuration in which the bottom portion 22a has a smaller width than the top portion 22b. In addition, the conductive cap 24 has a smaller width than the top portion 22b. As shown in FIG. 34, the micro bump 20f is broad in the middle and narrow at either end. In some embodiments, the conductive cap 24 may have similar width to the bottom portion 22a of the conductive bump 22. In some embodiments, the bottom portion 22a, top portion 22b and conductive cap 24 have different widths. The sidewall surfaces of the micro bump 20f are in zigzag configuration. One step is formed between the conductive cap 24 and the top portion 22b, and the other step is formed between the top portion 22b and the bottom portion 22a. The diffusion path between the conductive cap 24 and the conductive pad 12 is even more convoluted, which implies less foreign material contamination. In some embodiments, the micro bump 20f has a first portion, a second portion and a third portion. The first portion refers to the bottom portion 22a of the conductive bump 22, the second portion refers to the top portion 22b of the conductive bump 22, and the third portion refers to the conductive cap 24. The first, second and third portions of the micro bump 22f have varied widths. The second portion has a larger width than the first portion and the third portion respectively.

Figure 35:
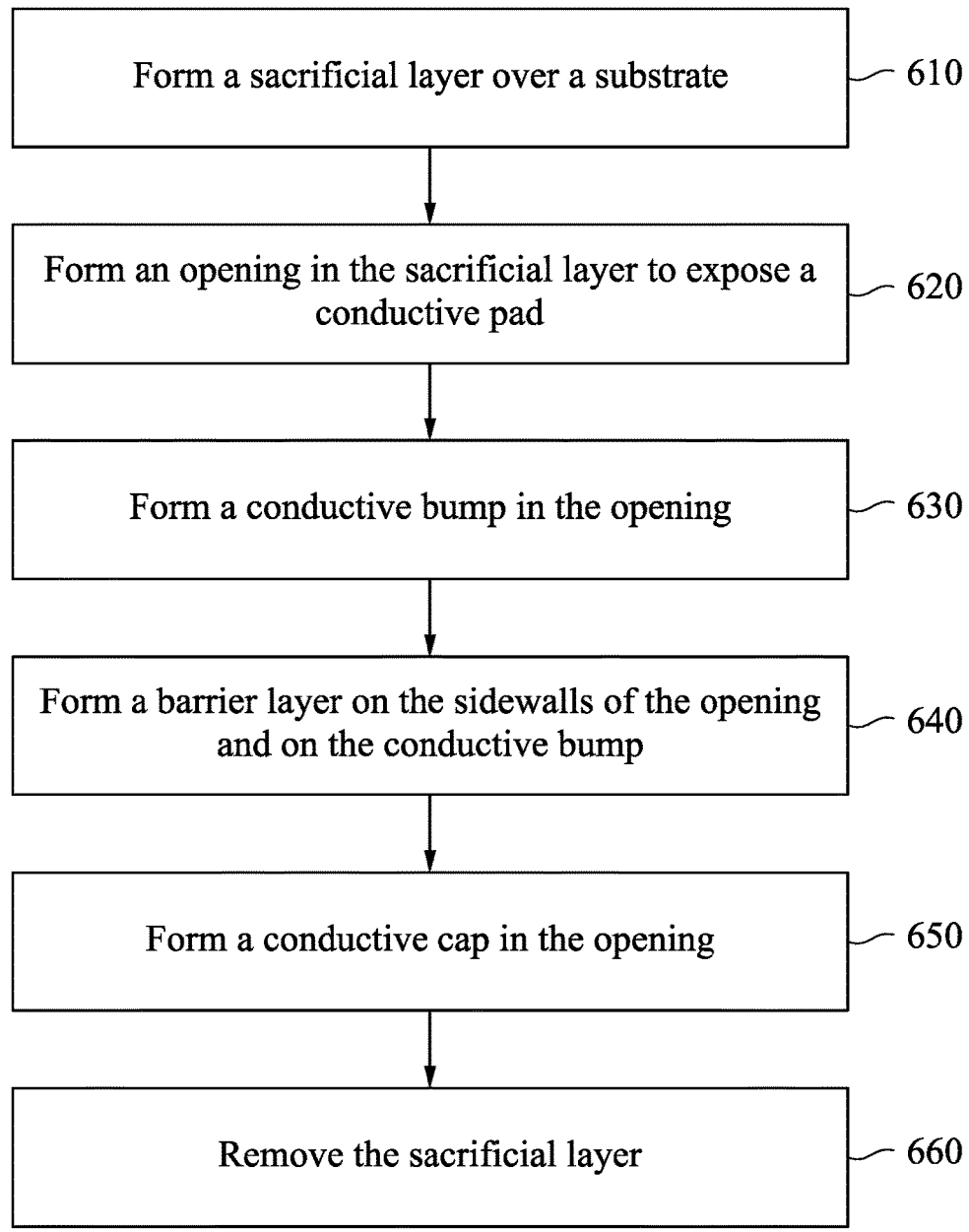
FIG. 35 is a flow chart illustrating a method of fabricating a semiconductor device in accordance with some embodiments of the instant disclosure.

Reference is made to FIG. 35, a flow chart of a method 600 of fabricating a semiconductor device in accordance with some embodiments of the instant disclosure. The method begins with operation 610 in which a sacrificial layer is formed over a semiconductor substrate. The method continues with operation 620 in which an opening is formed in the sacrificial layer to expose a portion of a conductive pad over the semiconductor substrate. Subsequently, operation 630 is performed. A conductive bump is formed in the opening. The method continues with operation 640 in which a barrier layer is formed on sidewalls of the opening and on a top surface of the conductive bump. The method continues with operation 650 in which a conductive cap is formed in the opening with the barrier layer interposing in between the conductive bump and the conductive cap. The method continues with operation 660 in which the first sacrificial layer is removed.

FIGS. 36-43 are cross-sectional views of a portion of a semiconductor device at various stages in a bump formation process in accordance with some embodiments of the instant disclosure.

Figure 36:
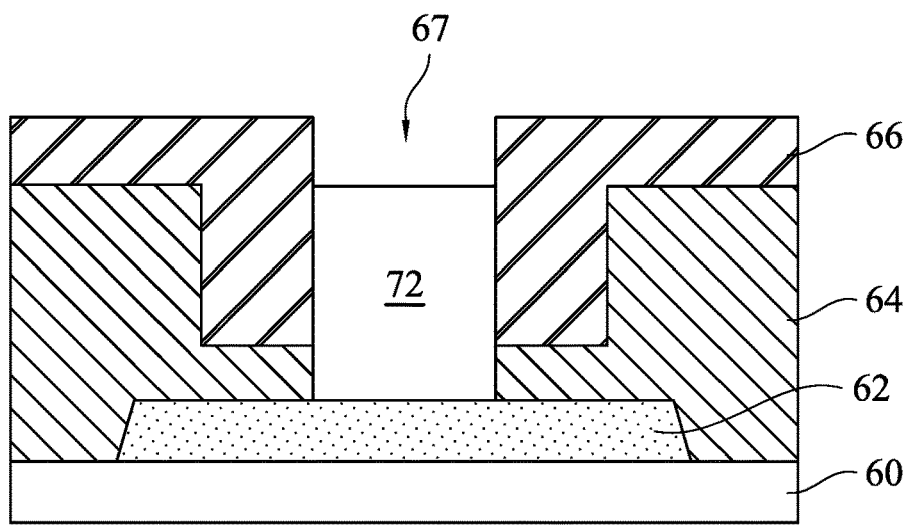
FIGS. 36-43 are cross-sectional views of a portion of a semiconductor device at various stages in a bump formation process in accordance with some embodiments of the instant disclosure.

With reference to FIG. 36, a semiconductor substrate 60 is used for bump fabrication in a semiconductor device fabrication, and integrated circuits may be formed therein and/or thereupon. A conductive pad 62, at least one passivation layer 64, and a first sacrificial layer 66 are formed over the substrate 60. Similar elements to those previously described are not repeated herein to avoid redundancy. FIG. 36 also depicts the passivation layer 64 and the first sacrificial layer 66 are patterned to form an opening 67 to expose a portion of the conductive pad 62. A conductive bump 72 fills in the opening 67 and covers the exposed portion of the conductive pad 62.

Figure 37:
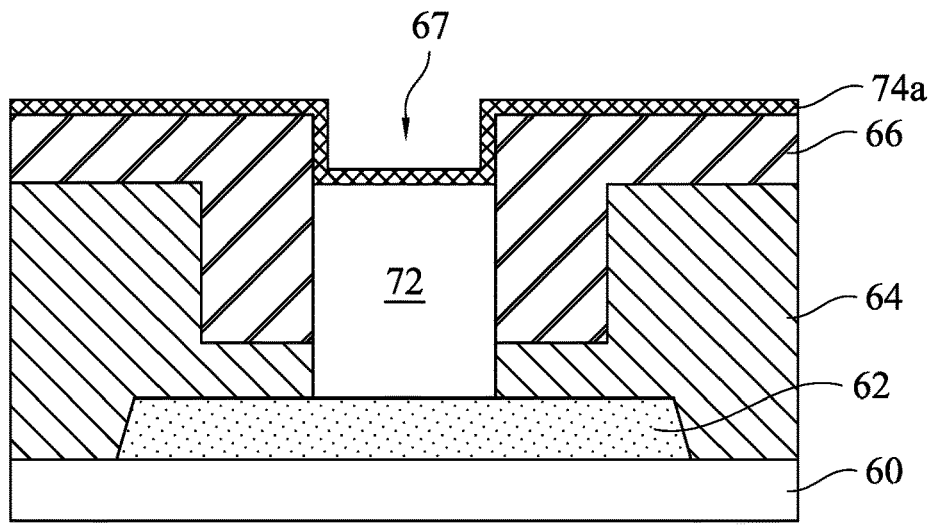

With reference to FIG. 37, a barrier layer 74a is formed on the first sacrificial layer 66 and in the opening 67 over the conductive bump 72. The barrier layer 74a is formed to cover the sidewalls and the bottom (top surface of the conductive bump 72) of the opening 67 of the first sacrificial layer 66. The barrier layer 74a is not in contact with the passivation layer 64. The barrier layer 74a may be formed of cobalt, titanium, combinations thereof, or the like. The formation methods include physical vapour deposition (PVD), sputtering, or the like.

Figure 38:
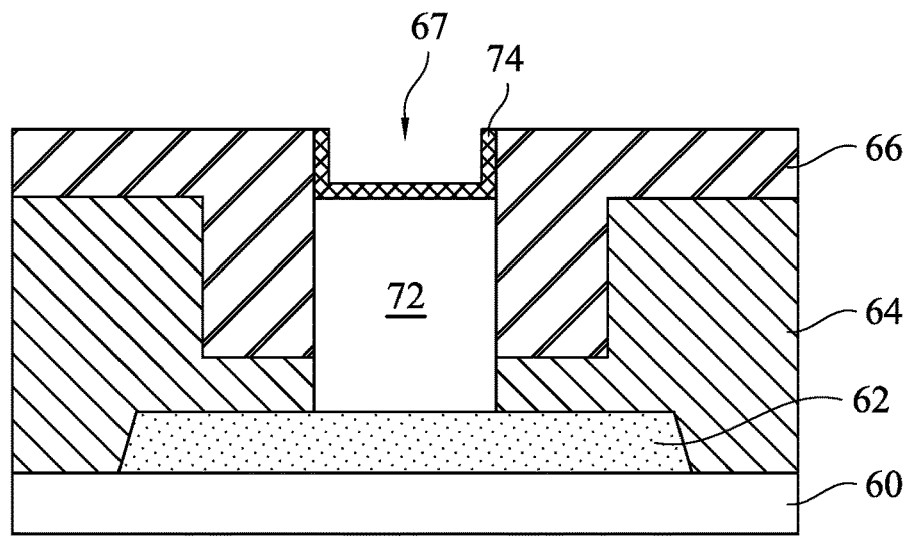

With reference to FIG. 38, a portion of the barrier layer 74a is removed. The barrier layer 74a may be removed by CMP or other suitable methods. After the removal, the barrier layer 74a on the surface of the first sacrificial layer 66 is removed. The remaining barrier layer 74 is on the sidewalls and bottom of the opening 67.

Figure 39:
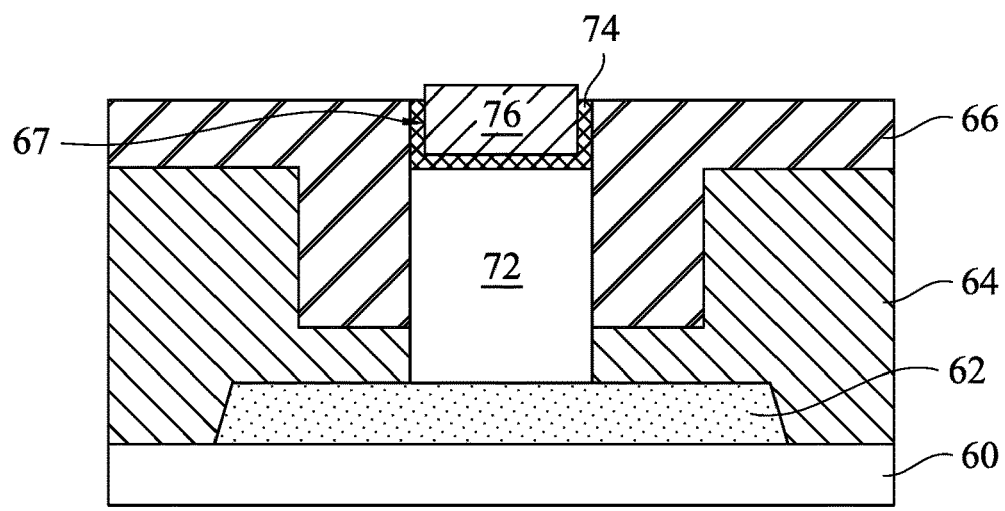

With reference to FIG. 39, a conductive cap 76 fills in the opening 67 over the barrier layer 74. The conductive cap 76 includes similar material as the conductive cap 24 (shown in FIG. 7), and its formation methods include electro-less plating or the like. The barrier layer 74 is like a bowl receiving the conductive cap 76. The conductive cap 76 slightly exceeds the edge of the barrier layer 74, so that a bottom portion of the conductive cap 76 is wrapped around by the barrier layer 74, while a small top portion of the conductive cap 76 protrudes over the barrier layer 74. The conductive bump 72, the conductive cap 76, and the barrier layer 74 include different materials. The top surface of the conductive cap 76 is not levelled with the first sacrificial layer 66 and the edge of the barrier layer 74. The top surface of the conductive cap 76 is in a position higher than a top surface of the passivation layer 64.

Figure 40:
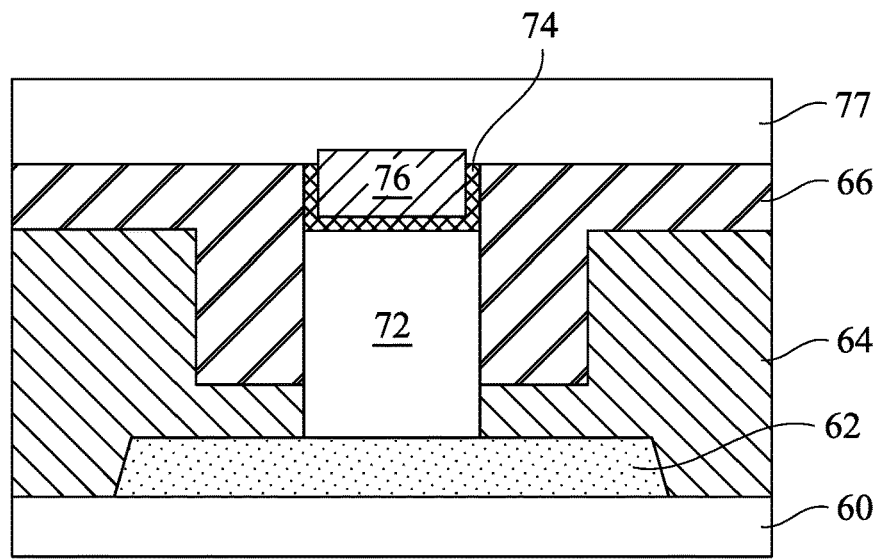

With reference to FIG. 40, a second sacrificial layer 77 is formed over the first sacrificial layer 66. The second sacrificial layer 77 may include tetraethoxysilane (TEOS) or the like. Because of the protruding conductive cap 76, when the second sacrificial layer 77 is formed on the first sacrificial layer 66, the protruding conductive cap 76 causes an indentation of the second sacrificial layer 77 at the interface.

Figure 41:
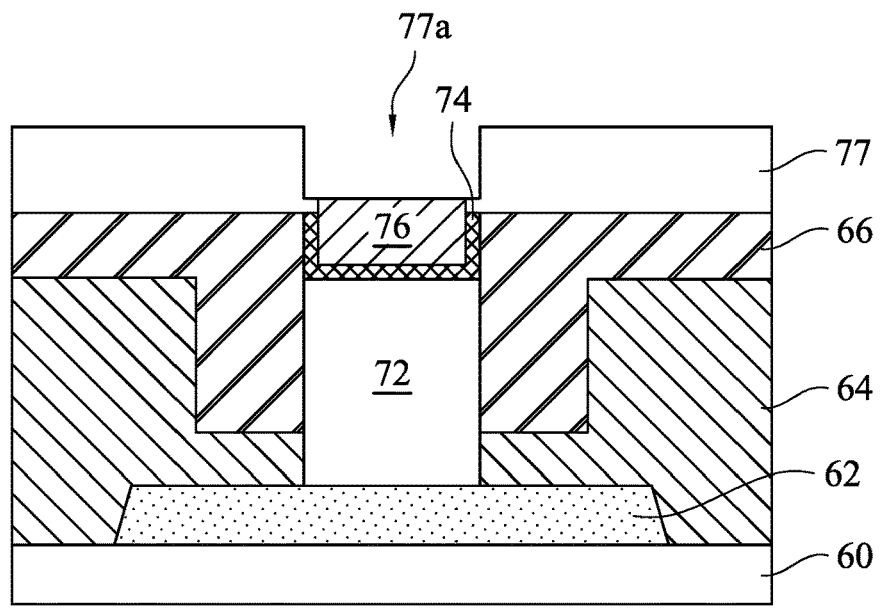

With reference to FIG. 41, the second sacrificial layer 77 is patterned to form an opening 77a. The opening 77a exposes the top surface of the conductive cap 76 and has a width similar to that of the conductive bump 72.

Figure 42:
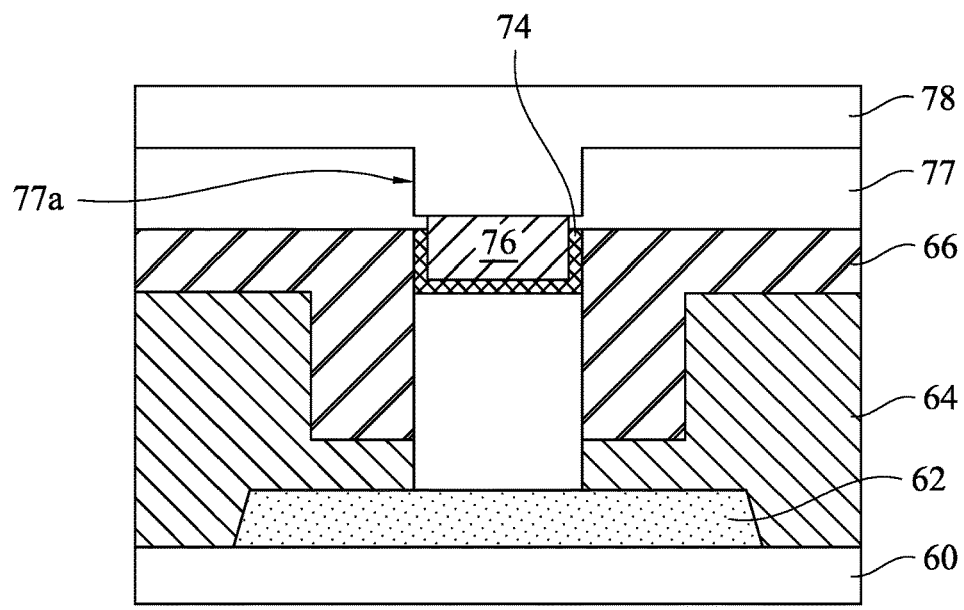

With reference to FIG. 42, an adhesion film 78 is formed on the second sacrificial layer 77 and fills in the opening 77a. The adhesion film 78 includes materials for example, bis-benzocyclobutene (BCB), polyimide (PI), polybenzoxazole (PBO), bismaleimidetriazne (BT) or the like. The adhesion film 78 shows stronger adhesion affinity toward the carrier wafer than the conductive cap 76.

Figure 43:
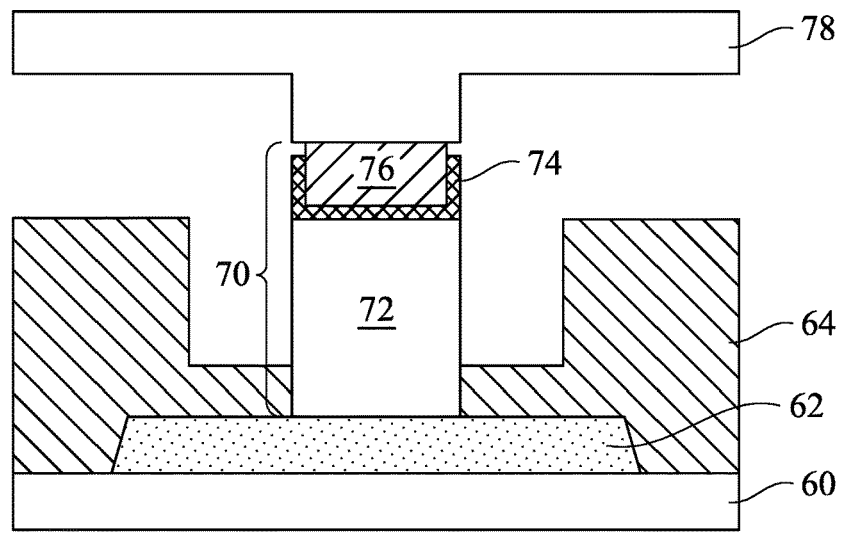

With reference to FIG. 43, the second sacrificial layer 77 and the first sacrificial layer 66 are removed by for example, diluted hydrofluoric acid (DHF) treatment or vapour hydrofluoric acid (VHF) treatment for a suitable time. In some embodiments, the semiconductor substrate 60 undergoes thin down process, and a carrier wafer (not shown) may be attached to the adhesion film 78. With higher adhesion affinity to the carrier wafer, the adhesion film 78 ensures the device wafer (micro bump 70) is provided with sufficient support from the carrier wafer during thinning down. The adhesion film 78 along with the carrier wafer is removed when the micro bump 70 is to be bonded with its counterpart.

Figure 44:
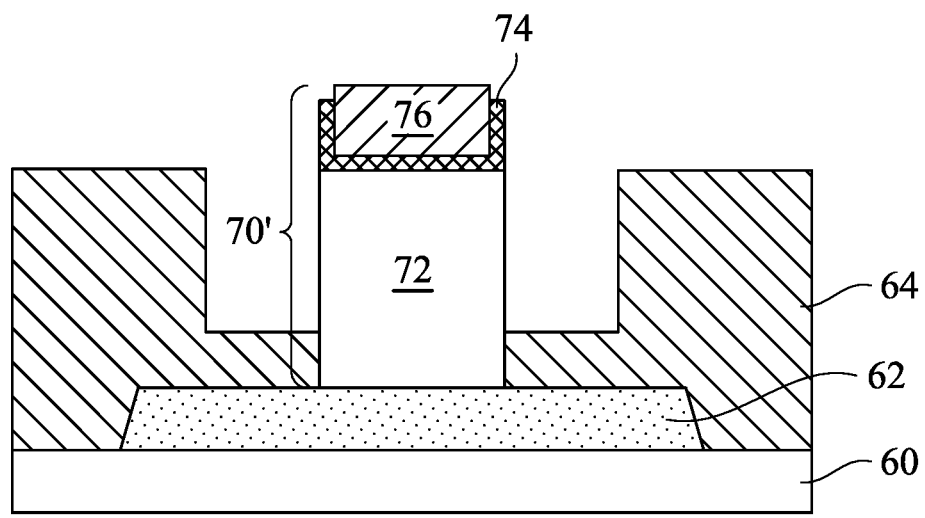
FIG. 44 is cross-sectional view of a portion of a semiconductor device at various stages in a bump formation process in accordance with some embodiments of the instant disclosure.

With reference to FIG. 44, in alternative embodiments, after the formation of the conductive cap 76 shown in FIG. 40, the first sacrificial layer 66 is removed to form the micro bump 70'. Difference between the micro bump 70' and micro bump 70 (shown in FIG. 44) arises from the post processing.

The micro bump 70' is independent from the adhesion film 78, and therefore the step of forming second sacrificial layer and adhesion film is omitted.

The structure shown in FIG. 44 may be attached to another substrate. The substrate may be glass of a display device or other suitable substrate. The connection structure 102 contacts a contact pad and/or a conductive trace on the substrate through, for example, a metal layer. The metal layer may include a metal with a low melting point such as indium, indium alloys, or the like. Using an exemplary coupling process including chip placement and thermo-compression bonding, a metal joint structure is formed between the two substrates.

The stepped sidewall surfaces of the micro bump creates a convoluted diffusion path between the conductive cap and the pad region. The diffusion path is often cut short due to the winding route that impurity has to travel. The conductive engagement between the conductive cap and a solder layer of another substrate is therefore more reliable and has uniform height.

In some embodiments, a semiconductor device includes a semiconductor substrate. A conductive pad is disposed over the semiconductor substrate. A conductive bump is disposed over the conductive pad. A conductive cap is disposed over the conductive bump. A combination of the conductive bump and the conductive cap has a stepped sidewall profile. At least one passivation layer is disposed over the semiconductor substrate and surrounding the conductive bump.

In some embodiments, a semiconductor device includes a semiconductor substrate. A conductive pad is disposed over the semiconductor substrate. A conductive bump is disposed over the conductive pad. A conductive cap is disposed over the conductive bump. A barrier layer wraps around a bottom portion of the conductive cap. At least one passivation layer is disposed over the semiconductor substrate and surrounding the conductive bump.

In some embodiments, a method of fabricating a semiconductor device includes forming a first sacrificial layer over a semiconductor substrate. Next, a first opening is formed in the first sacrificial layer to expose a conductive pad over the semiconductor substrate. Subsequently, a conductive bump is formed in the first opening. Then, a barrier layer is formed on sidewalls of the first opening and on a top surface of the conductive bump. Following that, a conductive cap is formed in the first opening with the barrier layer interposing in between the conductive bump and the conductive cap. The first sacrificial layer is then removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of fabricating a semiconductor device, the method comprising:
forming a first sacrificial layer over a semiconductor substrate;

forming a first opening in the first sacrificial layer to expose a conductive pad over the semiconductor substrate;

forming a conductive bump in the first opening;

forming a barrier layer on sidewalls of the first opening, on a top surface of the first sacrificial layer, and on a top surface of the conductive bump;

removing a portion of the barrier layer from the top surface of the first sacrificial layer;

forming a conductive cap in the first opening with the barrier layer interposing in between the conductive bump and the conductive cap; and removing the first sacrificial layer.

2. The method of fabricating the semiconductor device of claim 1, wherein the portion of the barrier layer on the top surface of the first sacrificial layer is removed by chemical mechanical planarization.

3. The method of fabricating the semiconductor device of claim 1, further comprising:

forming a second sacrificial layer over the first sacrificial layer after the forming the conductive cap in the first opening;

forming a second opening in the second sacrificial layer exposing a top surface of the conductive cap;

forming an adhesion film on the second sacrificial layer and in the second opening; and removing the second sacrificial layer.

4. The method of fabricating the semiconductor device of claim 1, wherein the barrier layer comprises titanium, cobalt, or combinations thereof.

5. A method of fabricating a semiconductor device, the method comprising:

forming a conductive pad above a substrate;

forming a passivation layer above the conductive pad;

forming a sacrificial layer above the passivation layer;

forming an opening in the passivation layer and the sacrificial layer, above the conductive pad, and that exposes the conductive pad, wherein forming the opening includes forming a first recess and a second recess that is above the first recess and that has a larger width than the first recess;

forming a micro bump in the opening; and removing the sacrificial layer from a sidewall of the micro bump.

6. The method of claim 5, further comprising forming the second recess that extends from a top surface of the sacrificial layer to a position above a bottom surface of the sacrificial layer.

7. The method of claim 5, further comprising forming the first recess that extends from a position between a top surface and a bottom surface of the sacrificial layer to a bottom surface of the passivation layer.

8. The method of claim 5, further comprising forming the second recess that extends from a top surface of the sacrificial layer to a bottom surface of the sacrificial layer.

9. The method of claim 5, further comprising forming the first recess that extends from a top surface of the passivation layer to a bottom surface of the passivation layer.

10. The method of claim 5, wherein forming the micro bump includes forming a conductive cap above a conductive bump such that the conductive cap has a higher top surface than the passivation layer.

11. The method of claim 10, further comprising:

filling the opening with the conductive bump;

conformally forming a second sacrificial layer in the opening;

removing the second sacrificial layer to expose the conductive bump; and filling the opening with the conductive cap.

12. The method of claim 5, further comprising forming a conductive cap above the micro bump.

13. A method of fabricating a semiconductor device, the method comprising:

forming a conductive pad above a substrate;

forming a passivation layer above the conductive pad;

forming a first sacrificial layer above the passivation layer;

forming an opening in the passivation layer and the first sacrificial layer, above the conductive pad, and that exposes the conductive pad;

forming a micro bump in the opening; and removing the first sacrificial layer, such that an inner sidewall of the passivation layer faces and is spaced from an outer sidewall of the micro bump.

14. The method of claim 13, further comprising:

forming a second sacrificial layer above the first sacrificial layer;

forming the opening that extends from a top surface of the second sacrificial layer to a bottom surface of the passivation layer through the first sacrificial layer; and removing the first and second sacrificial layers.

15. The method of claim 14, further comprising forming a second recess that extends from the top surface of the second sacrificial layer to a position between top and bottom surfaces of the first sacrificial layer.

16. The method of claim 14, wherein forming the micro bump includes forming a conductive cap above a conductive bump such that the conductive cap has a higher top surface than the passivation layer.

17. The method of claim 16, further comprising:

filling the opening with a bottom portion of the conductive bump;

conformally forming the second sacrificial layer in the opening;

removing the second sacrificial layer to expose the conductive bump; and filling the opening with the conductive cap.

18. The method of claim 17, further comprising, prior to filling the opening with the conductive cap, filling the opening with a top portion of the conductive bump.

19. The method of claim 13, further comprising forming a first recess that extends from a position between top and bottom surfaces of the first sacrificial layer to a bottom surface of the passivation layer.

20. The method of claim 13, further comprising forming a conductive cap above the micro bump.

* * * * *